(12) United States Patent
Yun et al.

(10) Patent No.: US 11,527,473 B2
(45) Date of Patent: Dec. 13, 2022

(54) SEMICONDUCTOR MEMORY DEVICE INCLUDING CAPACITOR

(71) Applicant: Samsung Electronics Co., Ltd., Suwon-si (KR)

(72) Inventors: Kyung Hwa Yun, Hwaseong-si (KR); Chan Ho Kim, Seoul (KR); Dong Ku Kang, Seongnam-si (KR); Bong Soon Lim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 103 days.

(21) Appl. No.: 17/038,521

(22) Filed: Sep. 30, 2020

(65) Prior Publication Data

US 2021/0143096 A1 May 13, 2021

Related U.S. Application Data

(63) Continuation-in-part of application No. 16/886,898, filed on May 29, 2020.

(30) Foreign Application Priority Data

Nov. 12, 2019 (KR) ........................ 10-2019-0144018

(51) Int. Cl.
*H01L 23/522* (2006.01)
*H01L 25/065* (2006.01)
(Continued)

(52) U.S. Cl.
CPC .......... *H01L 23/5223* (2013.01); *H01L 24/08* (2013.01); *H01L 25/0657* (2013.01);
(Continued)

(58) Field of Classification Search
CPC . H01L 23/5223; H01L 24/08; H01L 25/0657; H01L 25/18
See application file for complete search history.

(56) References Cited

U.S. PATENT DOCUMENTS 7,910,973 B2 3/2011 Sakaguchi et al.
8,643,142 B2 2/2014 Higashitani et al.
(Continued)

FOREIGN PATENT DOCUMENTS

JP 2016225364 A 12/2016
KR 20130070153 A 6/2013

OTHER PUBLICATIONS

Office Action dated Mar. 29, 2022, issued in corresponding U.S. Appl. No. 16/886,898.
(Continued)

*Primary Examiner* — Nathan W Ha
(74) *Attorney, Agent, or Firm* — Harness, Dickey & Pierce, P.L.C.

(57) ABSTRACT

A three-dimensional (3D) semiconductor memory device includes a peripheral logic structure disposed on a first substrate, a horizontal semiconductor layer disposed on a second substrate, a plurality of stack structures on the horizontal semiconductor layer in a first direction, wherein the plurality of stack structures include a memory cell region and a capacitor region, a plurality of electrode isolation regions extending in the first direction and a second direction and configured to separate the plurality of stack structures to be connected to the horizontal semiconductor layer and a plurality of through-via structures having a first side connected to a through channel contact through at least one metal pad, wherein a capacitor is formed between each of electrode pads and at least one of electrode isolation regions in the plurality of stack structures or at least one of the plurality of through-via structures.

20 Claims, 19 Drawing Sheets

(51) Int. Cl.
*H01L 25/18* (2006.01)
*H01L 23/00* (2006.01)

(52) U.S. Cl.
CPC .... *H01L 25/18* (2013.01); *H01L 2224/08145* (2013.01); *H01L 2924/1431* (2013.01); *H01L 2924/14511* (2013.01); *H01L 2924/19041* (2013.01)

(56) References Cited

U.S. PATENT DOCUMENTS

| | | | |
|---|---|---|---|
| 9,082,555 B2 | 7/2015 | Kwong | |
| 9,190,499 B2 | 11/2015 | Hirai et al. | |
| 9,601,577 B1* | 3/2017 | Lee | H01L 27/10897 |
| 9,646,981 B2 | 5/2017 | Nishikawa et al. | |
| 9,876,031 B1* | 1/2018 | Shimizu | H01L 29/42344 |
| 9,991,282 B1 | 6/2018 | Shimizu et al. | |
| 10,199,375 B2 | 2/2019 | Nojima | |
| 2016/0268287 A1 | 9/2016 | Park et al. | |
| 2017/0069651 A1 | 3/2017 | Sakamoto et al. | |
| 2017/0263618 A1 | 9/2017 | Shimojo | |
| 2018/0047739 A1 | 2/2018 | Dorhout et al. | |
| 2018/0277517 A1* | 9/2018 | Kim | H01L 43/08 |
| 2019/0081069 A1* | 3/2019 | Lu | H01L 27/11575 |
| 2019/0088589 A1* | 3/2019 | Zhu | H01L 27/0688 |
| 2019/0296032 A1 | 9/2019 | Noda | |
| 2020/0152654 A1* | 5/2020 | Hwang | H01L 27/11565 |
| 2020/0251443 A1* | 8/2020 | Kanakamedala | H01L 24/94 |
| 2020/0357771 A1* | 11/2020 | Kim | H01L 27/016 |
| 2021/0036001 A1* | 2/2021 | Kim | H01L 27/11556 |
| 2021/0134819 A1* | 5/2021 | Zhang | H01L 27/11573 |

OTHER PUBLICATIONS

Partial European Search Report dated Mar. 16, 2021, issued in corresponding European Patent Application No. 20202906.2.
Notice of Allowance dated Sep. 22, 2022, issued in corresponding U.S. Appl. No. 16/886,898.

* cited by examiner

SEMICONDUCTOR MEMORY DEVICE INCLUDING CAPACITOR

CROSS-REFERENCE TO RELATED APPLICATION

This application is a Continuation-in-Part of U.S. patent application Ser. No. 16/886,898, filed on May 29, 2020, which claims priority to Korean Patent Application No. 10-2019-0144018, filed on Nov. 12, 2019, and all the benefits accruing therefrom under 35 U.S.C. § 119, the disclosure of each of which is incorporated herein by reference in its entirety.

BACKGROUND

1. Field

The present disclosure relates to a semiconductor memory device, and more particularly, to a three-dimensional (3D) semiconductor memory device including a capacitor and/or having an improved reliability and integration density.

2. Description of Related Art

There is a demand for improving the integration density of semiconductor memory devices in order to meet consumers' interest of high performance and low price. Since integration density is an important factor that determines the price of a semiconductor memory device, an improvement in integration density is desired. The integration density of a two-dimensional (2D) (or planar) semiconductor memory device is determined by the area occupied by each unit memory cell and thus may be affected by the level of fine pattern forming technology.

However, since expensive equipment may be used to fabricate fine patterns, there is a clear limit in increasing the integration density of a 2D semiconductor memory device. Thus, a memory device in which memory cells are arranged three-dimensionally has been suggested.

SUMMARY

Embodiments of the present disclosure provide a semiconductor memory device including a vertical channel structure with an improved reliability and integration density.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to an embodiment, a three-dimensional (3D) semiconductor memory device includes a first substrate including at least one first metal pad, a peripheral logic structure disposed on the first substrate and including a plurality of peripheral circuits, a second substrate disposed parallel to the first substrate and including at least one second metal pad, a horizontal semiconductor layer disposed on the second substrate, wherein the first metal pad and the second metal pad are vertically disposed and electrically connected to each other, a plurality of stack structures in which mold layers and electrode pads are alternately stacked on the horizontal semiconductor layer in a first direction, wherein the plurality of stack structures include a memory cell region and a capacitor region and are electrically connected to the peripheral circuits, a plurality of electrode isolation regions extending in the first direction and a second direction and configured to separate the plurality of stack structures to be connected to the horizontal semiconductor layer and a plurality of through-via structures configured to pass through the plurality of stack structures in the first direction in the capacitor region in the second substrate and having a first side connected to a through channel contact through the at least one second metal pad, wherein a capacitor is formed between each of the electrode pads and at least one of the plurality of electrode isolation regions or at least one of the plurality of through-via structures.

According to an embodiment, a three-dimensional (3D) semiconductor memory device includes a first substrate including a plurality of first metal, a horizontal semiconductor layer disposed on the first substrate, a plurality of stack structures in which mold layers and electrode pads are alternately stacked on the horizontal semiconductor layer in a first direction and which include a memory cell region and a capacitor region, a plurality of electrode isolation regions extending in the first direction and a second direction on the first substrate and which are spaced apart from each other in a third direction and separate the plurality of stack structures to be connected to at least one of the first metal pads, a plurality of through-via structures configured to pass through the stack structures in the first direction in the capacitor region between at least two adjacent electrode isolation regions and having a first side connected to at least another one of the first metal pads, a second substrate disposed parallel to the first substrate and including a plurality of second metal pads disposed to correspond to the plurality of first metal pads and a plurality of peripheral circuits which are disposed on the second substrate and electrically connected to the first metal pads through the second metal pads, wherein the plurality of stack structures in the capacitor region have the same width and are stacked in the second direction and the third direction.

According to an embodiment, a three-dimensional (3D) semiconductor memory device includes a first substrate and a second substrate disposed parallel to the first substrate, wherein a plurality of first metal pads of the first substrate are disposed to be perpendicular to a plurality of second metal pads of the second substrate and are electrically connected to the plurality of second metal pads of the second substrate, the first substrate includes a horizontal semiconductor layer disposed on the first substrate, capacitor region in which mold layers and electrode pads are alternately disposed on the horizontal semiconductor layer, a plurality of electrode isolation regions each extending in a word line direction and a vertical direction so that the capacitor region is disposed to be spaced apart from each other, a mold region disposed between two adjacent electrode isolation regions among the plurality of electrode isolation regions, a plurality of through-via structures each passing through the mold regions in the vertical direction, and a plurality of first metal pads connected to first sides of the plurality of electrode isolation regions or to first sides of the plurality of through-via structures, the second substrate includes a plurality of peripheral circuits disposed on the second substrate, and second metal pads disposed on the plurality of peripheral circuits and each of which is disposed in the vertical direction and electrically connected to the first metal pad, and a capacitor is formed between each of the electrode pads and at least one of the plurality of through-via structures or at least one of the plurality of electrode isolation regions.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

Figure 1:
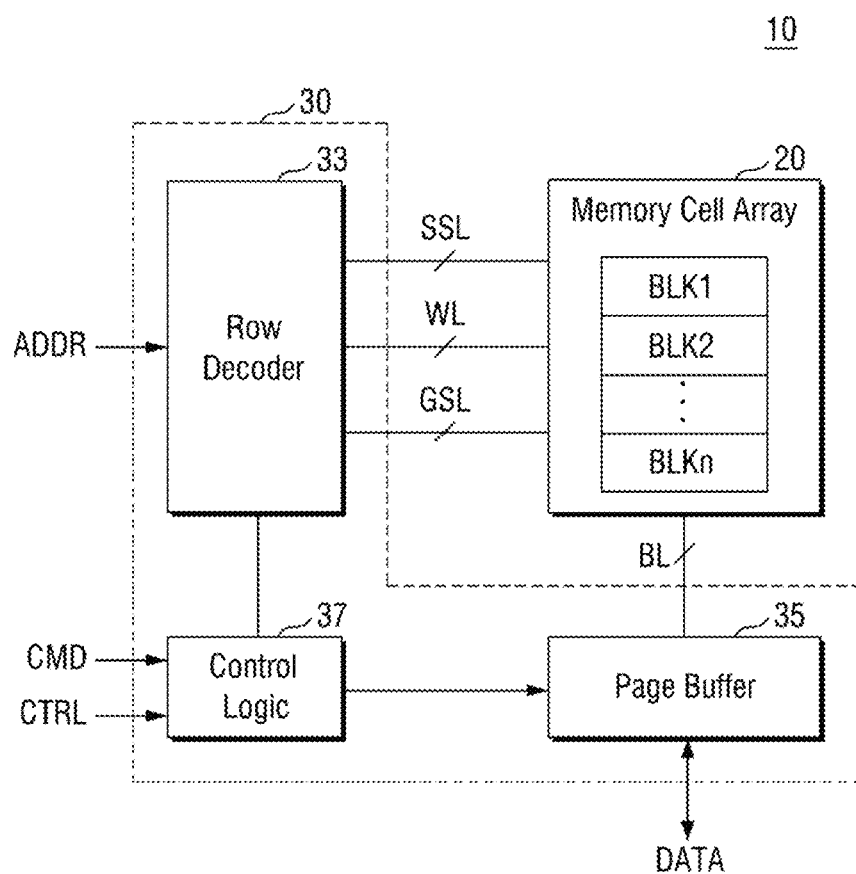
FIG. 1 is a block diagram of a semiconductor memory device according to some embodiments of the present disclosure.

FIG. 1 is a block diagram of a semiconductor memory device according to some embodiments of the present disclosure.

Referring to FIG. 1, a semiconductor memory device 10 may include a memory cell array 20 and a peripheral circuit 30.

The semiconductor memory device 10 may include, for example, a NAND flash memory, a vertical NAND (VNAND) flash memory, a NOR flash memory, a resistive random access memory (RRAM), a phase-change random access memory (PRAM), a magneto-resistive random access memory (MRAM), a ferroelectric random access memory (FRAM), a spin transfer torque-random access memory (STT-RAM), or the like, but the present disclosure is not limited thereto.

The semiconductor memory device 1 will hereinafter be described as being, for example, a VNAND flash memory, but the present disclosure is not limited thereto. That is, the present disclosure is also applicable to other nonvolatile memories.

The memory cell array 20 may include a plurality of memory cell blocks BLK1 through BLKn. Each of the memory cell blocks BLK1 through BLKn may include a plurality of memory cells. The memory cell blocks BLK1 through BLKn may be connected to the peripheral circuit 30 via bitlines BL, wordlines WL, one or more string selection lines SSL, and one or more ground selection lines GSL.

Specifically, the memory cell blocks BLK1 through BLKn may be connected to a row decoder 33 via the wordlines WL, the string selection lines SSL, and the ground selection lines GSL. Also, the memory cell blocks BLK1 through BLKn may be connected to a page buffer 35 via the bitlines BL.

The peripheral circuit 30 may receive an address ADDR, a command CMD, and a control signal CTRL from outside the semiconductor memory device 10 and may exchange data with an external device (not illustrated) on the outside of the semiconductor memory device 10. The peripheral circuit 30 may include a control logic 37, the row decoder 33, and the page buffer 35.

Although not specifically illustrated, the peripheral circuit 30 may further include various sub-circuits such as an input/output (I/O) circuit, a voltage generation circuit for generating various voltages necessary for operating the semiconductor memory device 10, and an error correction circuit for correcting error in the data read from the memory cell array 20.

The control logic 37 may be connected to the row decoder 33, the voltage generation circuit, and the I/O circuit. The control logic 37 may control a general operation of the semiconductor memory device 10. The control logic 37 may generate various internal control signals for use in the semiconductor memory device 10 in response to the control signal CTRL.

The control logic 37 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The row decoder 33 and page 35 also may include processing circuitry.

The control logic 37 may operate in response to control signals CTRL, commands CMD, or instructions input thereto from an external source (e.g., host, not shown) and may be configured to access the memory cell array 20 and control operations of the semiconductor memory device 10 discussed herein.

For example, the control logic 37 may control the levels of voltages provided to the wordlines WL and the bitlines BL during a memory operation such as a program operation or an erase operation.

The row decoder 33 may select at least one of the memory cell blocks BLK1 through BLKn in response to the address ADDR and may select at least one of the wordlines WL, at least one of the string selection lines SSL, and at least one of the ground selection lines GSL of the selected memory cell block. The row decoder 33 may transmit a voltage for performing a memory operation on the wordlines WL of the selected memory cell block.

The page buffer 35 may be connected to the memory cell array 20 via the bitlines BL. The page buffer 35 may operate as a write driver or a sense amplifier. Specifically, during a program operation, the page buffer 35 may operate as a write driver and may apply, to the bitlines BL, a voltage corresponding to the data to be stored in the memory cell array 20. During a read operation, the page buffer 35 may operate as a sense amplifier and may sense the data stored in the memory cell array 20.

Figure 2:
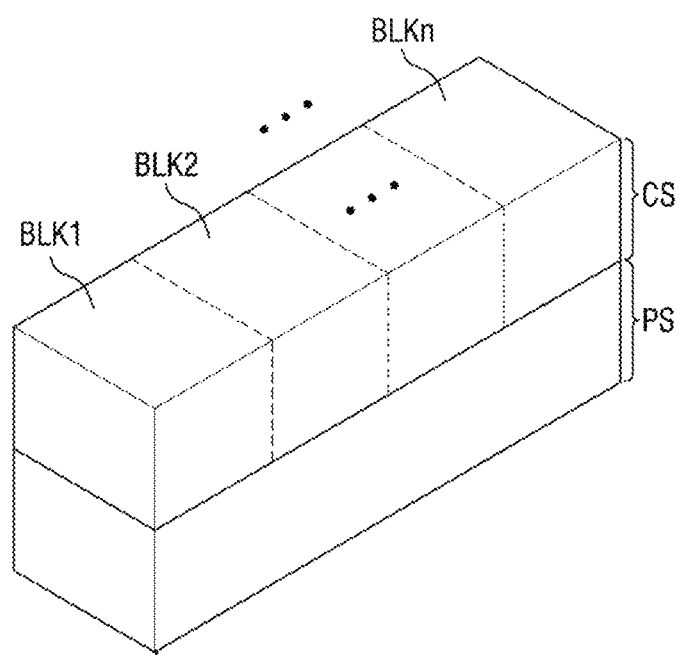
FIG. 2 is a perspective view of a semiconductor memory device according to some embodiments of the present disclosure.

FIG. 2 is a perspective view of a semiconductor memory device according to some embodiments of the present disclosure.

Referring to FIG. 2, the semiconductor memory device may include a peripheral logic structure PS and a cell array structure CS.

The cell array structure CS may be stacked on the peripheral logic structure PS. That is, in a plan view, the peripheral logic structure PS and the cell array structure CS may overlap with each other. The semiconductor memory device may have a Cell-Over-Peri (COP) structure.

For example, the cell array structure CS may include the memory cell array 20 of FIG. 1. The peripheral logic structure PS may include the peripheral circuit 30 of FIG. 1.

The cell array structure CS may include a plurality of memory cell blocks BLK1 through BLKn, which are disposed on the peripheral logic structure PS.

Figure 3:
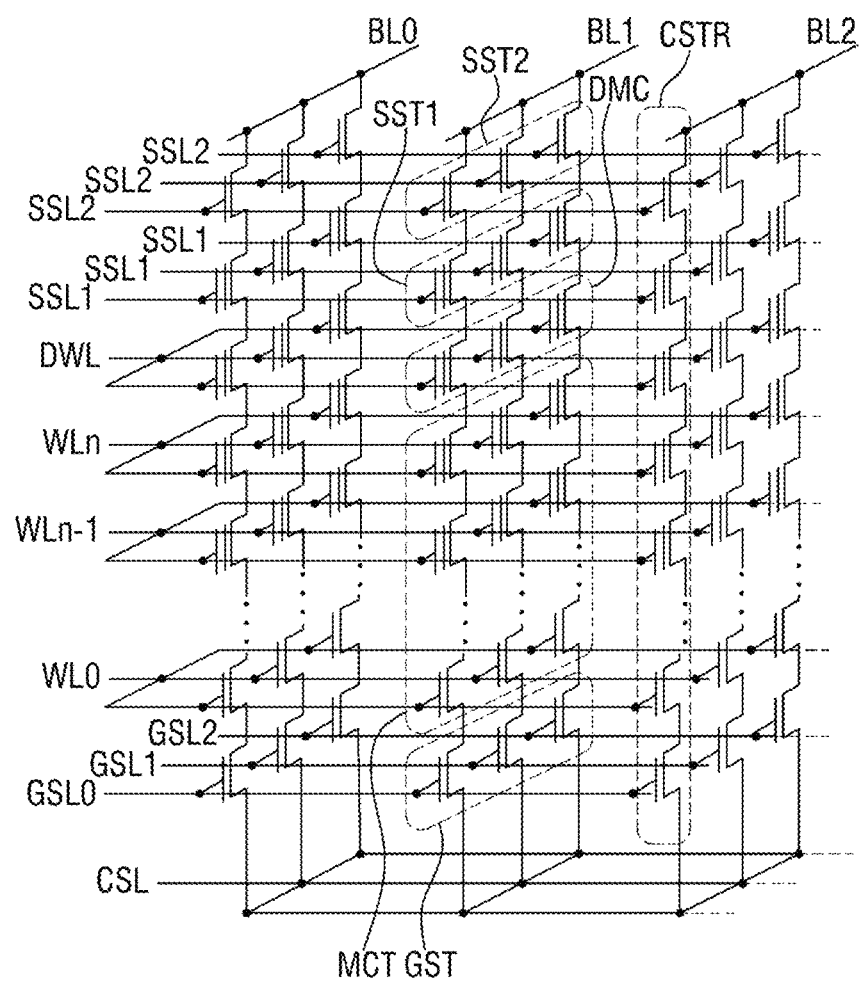
FIG. 3 is a circuit diagram illustrating one of a plurality of memory cell blocks included in a semiconductor memory device according to some embodiments of the present disclosure.

FIG. 3 is a circuit diagram illustrating one of a plurality of memory cell blocks included in a semiconductor memory device according to some embodiments of the present disclosure.

Referring to FIG. 3, a memory cell block according to some embodiments of the present disclosure may include a common source line CSL, a plurality of bitlines BL0 through BL2, and a plurality of cell strings CSTR, which are disposed between the common source line CSL and the bitlines BL.

The cell strings CSTR may be connected in parallel to each of the bitlines BL0 through BL2. The cell strings CSTR may be connected in common to the common source line CSL. That is, the cell strings CSTR may be disposed between the common source line CSL and the bitlines BL0 through BL2. A plurality of common source lines CSL may be arranged two-dimensionally. The same voltage may be applied to the plurality of common source lines CSL, or the plurality of common source lines CSL may be separately controlled electrically.

For example, each of the cell strings CSTR may include string selection transistors (SST1 and SST2), which are connected in series, memory cells MCT, which are connected in series, and a ground selection transistor GST. Each of the memory cells MST includes a data storage element.

For example, each of the cell strings CSTR may include first and second string selection transistors SST1 and SST2, which are connected in series, the second string selection transistor SST2 may be connected to one of the bitlines BL0 through BL2, and the ground selection transistor GST may be connected to the common source line CSL. Memory cells MCT may be connected in series between the first string selection transistor SST1 and the ground selection transistor GST.

Each of the cell strings CSTR may further include a dummy cell DMC, which is connected between the first string selection transistor SST1 and the memory cells MCT. Although not specifically illustrated, the dummy cell DMC may also be connected between the ground selection transistor GST and the memory cells MCT. The ground selection transistor GST may include a plurality of metal oxide semiconductor (MOS) transistors, which are connected in series. In another example, each of the cell strings CSTR may include only one string selection transistor.

In some embodiments, the first string selection transistor SST1 may be controlled by a first string selection line SSL1, and the second string selection transistor SST2 may be controlled by a second string selection line SSL2. The memory cells MCT may be controlled by a plurality of wordlines WL0 through WLn, and the dummy cell DMC may be controlled by a dummy wordline DWL. The ground selection transistor GST may be controlled by ground selection lines GSL. The common source line CSL may be connected in common to the sources of the ground selection transistors GST of the cell strings CSTR.

Each of the cell strings CSTR may consist of a plurality of memory cells MCT, which have different distances from the common source line CSL. A plurality of wordlines (WL0 through WLn and DWL) may be disposed between the common source line CSL and the bitlines BL0 through BL2.

The gate electrodes of memory cells MCT at substantially the same distance from the common source line CSL may be connected in common to one of the wordlines (WL0 through WLn and DWL) and may thus be in an equipotential state. Even if the gate electrodes of memory cells MCT are disposed on substantially the same level from the common source line CSL, they can be controlled independently if they are arranged in different rows or different columns.

The ground selection lines GSL0 through GSL2 and the string selection lines SSL1 and SSL2 may extend in the same direction as the wordlines (WL0 through WLn and DWL). The ground selection lines GSL0 through GSL2 and the string selection lines SSL1 and SSL2 are disposed on substantially the same level and be electrically isolated.

Figure 4:
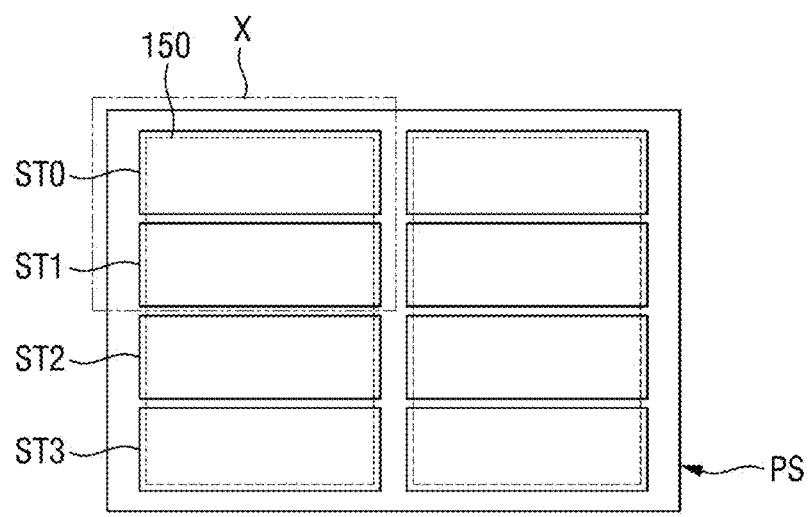
FIG. 4 is a layout view of a semiconductor memory device according to some embodiments of the present disclosure.
Figure 4:
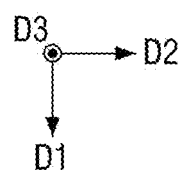
Figure 5A:
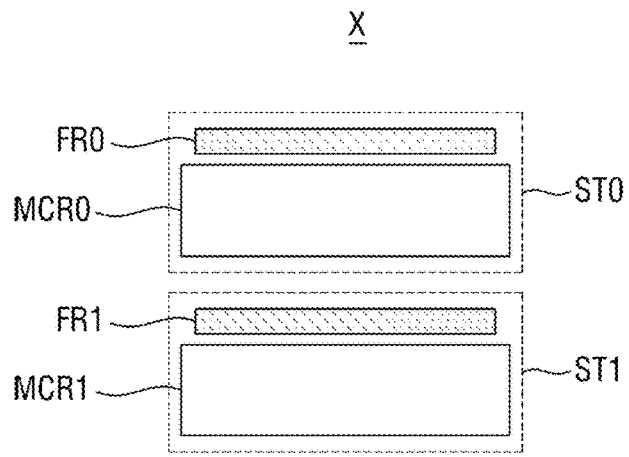
FIGS. 5A and 5B are plan views illustrating some of a plurality of stack structures illustrated in FIG. 4.
Figure 5A:
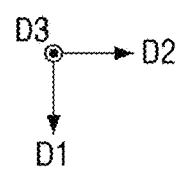
Figure 5B:
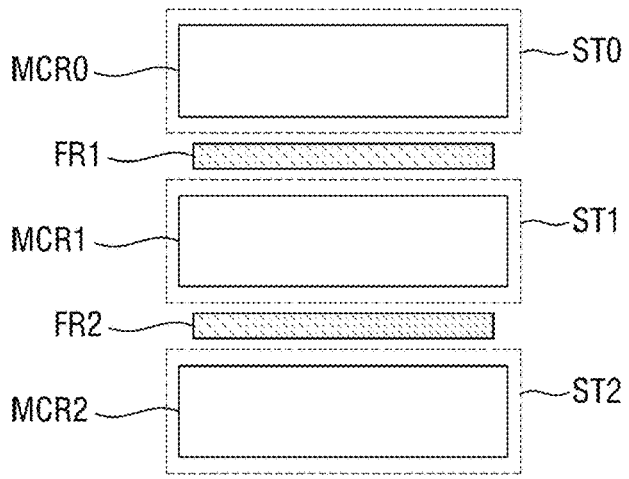
Figure 5B:
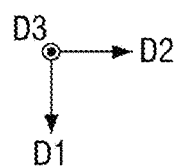
Figure 6:
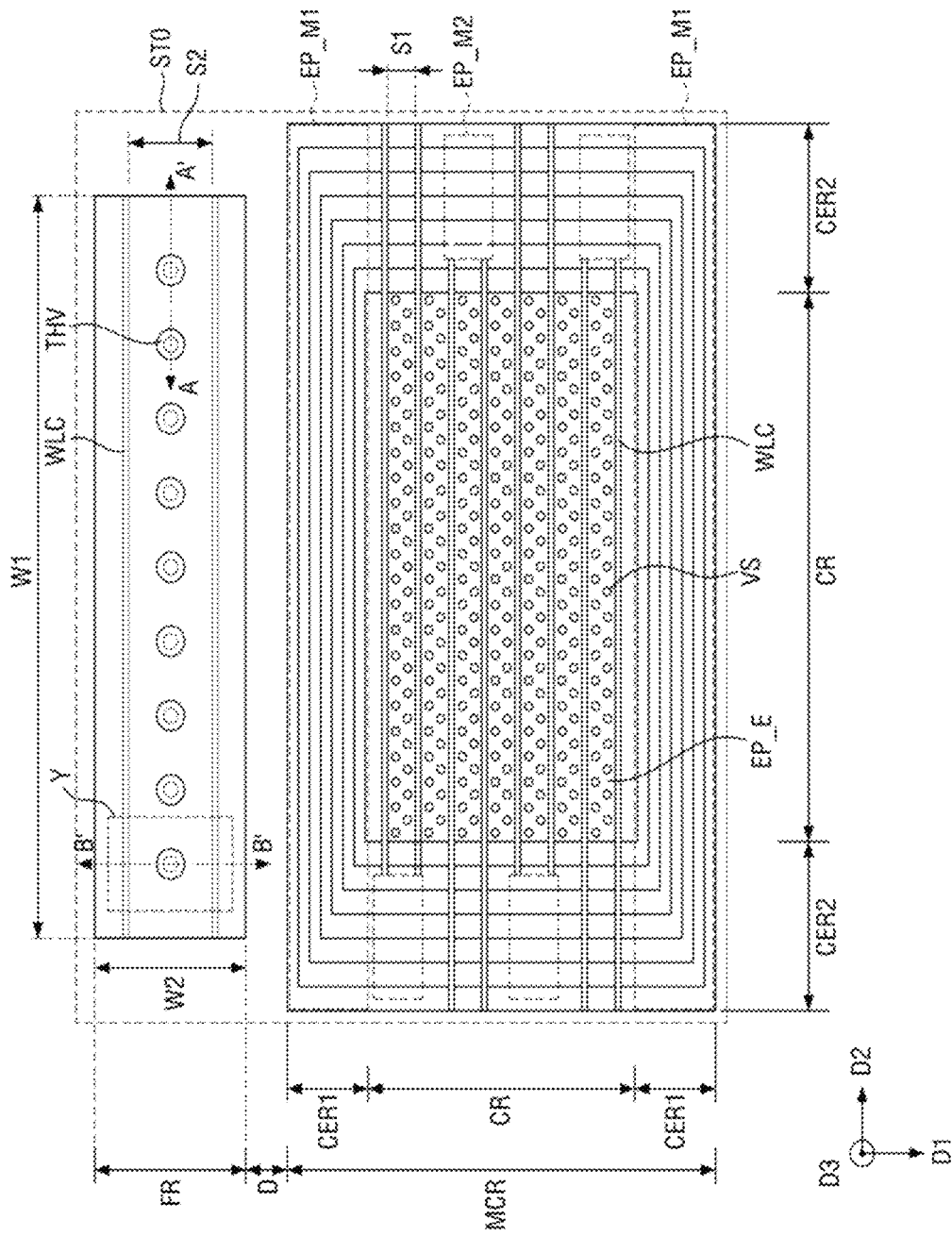
FIG. 6 is a plan view illustrating one of the stack structures illustrated in FIG. 4.
Figure 7:
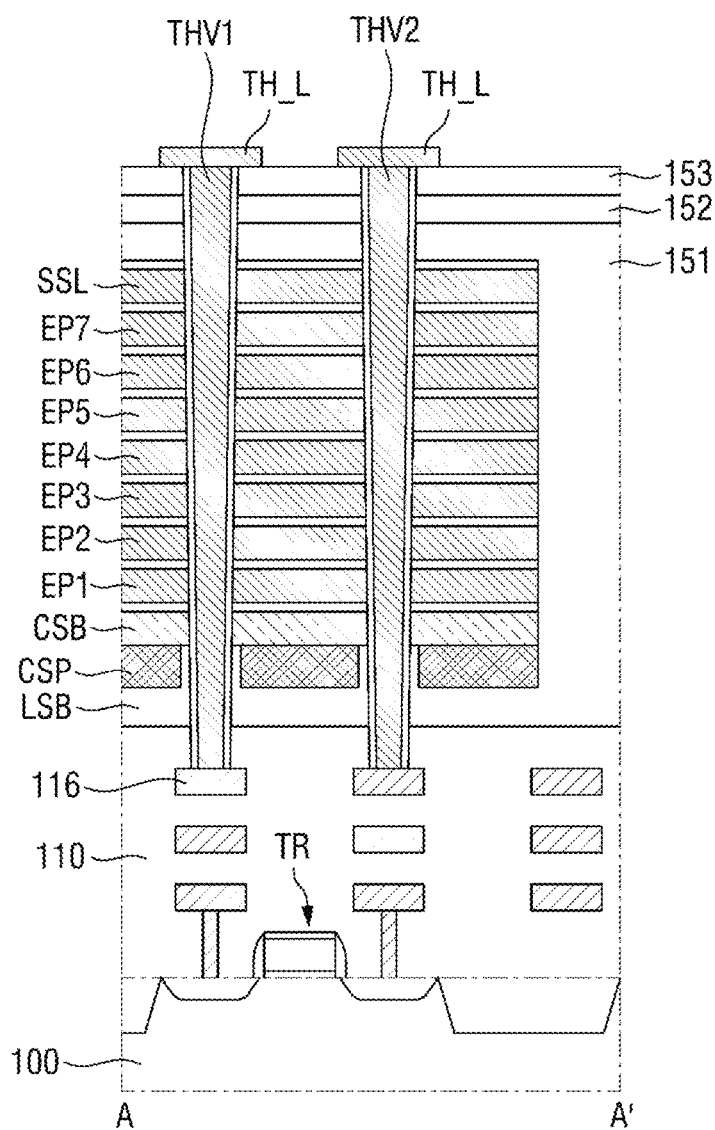
FIG. 7 is a cross-sectional view taken along line A-A' of FIG. 6.

FIG. 4 is a layout view of a semiconductor memory device according to some embodiments of the present disclosure, and FIGS. 5A and 5B are plan views illustrating some of a plurality of stack structures illustrated in FIG. 4. FIG. 6 is a plan view illustrating one of the stack structures illustrated in FIG. 4, and FIG. 7 is a cross-sectional view taken along line A-A' of FIG. 6.

A semiconductor memory device 10 may include a peripheral logic structure PS and a cell array structure CS.

The peripheral logic structure PS may include one or more peripheral circuits TR and a plurality of lower connecting wiring bodies 116. The peripheral circuits TR may be formed on a substrate 100. The peripheral circuits TR may be included in the page buffer 35 of FIG. 1 and/or in the row decoder 33 of FIG. 1. The peripheral circuits TR will be described later in detail with reference to FIG. 11.

The substrate 100 may be a bulk silicon substrate or a silicon-on-insulator (SOI) substrate. Alternatively, the substrate 100 may be a silicon substrate or may include another material such as, for example, silicon germanium, silicon germanium-on-insulator (SGOI), indium antimonide, a lead tellurium compound, indium arsenide, indium phosphide, gallium arsenide, or gallium antimonide, but the present disclosure is not limited thereto.

A peripheral logic insulating film 110 may be formed on the substrate 100. The peripheral logic insulating film 110 may include at least one of, for example, silicon oxide, silicon nitride, and silicon oxynitride.

A lower connecting wiring body 116 may be formed in the peripheral logic insulating film 110. The lower connecting wiring body 116 may include a plurality of wiring lines. The lower connecting wiring body 116 may include a plurality of layers, and in each of the layers, at least one wiring line may be disposed. The lower connecting wiring body 116 may be connected to a peripheral circuit TR.

The cell array structure CS may include a plurality of horizontal semiconductor layers 150, which are disposed on the peripheral logic structure PS, and a plurality of first through fourth stack structures ST0 through ST3, which are disposed on each of the horizontal semiconductor layers 150.

The horizontal semiconductor layers 150 may be disposed on the peripheral logic structure PS. The horizontal semiconductor layers 150 may extend along the top surface of the peripheral logic structure PS.

Each of the horizontal semiconductor layers 150 may include a lower support semiconductor layer LSB and a common source plate CSP, which is disposed on the lower support semiconductor layer LSB. The horizontal semiconductor layers 150 may include at least one of, for example, silicon (Si), germanium (Ge), silicon germanium (SiGe), gallium arsenide (GaAs), indium gallium arsenide (InGaAs), aluminum gallium arsenide (AlGaAs), and a mixture thereof. The horizontal semiconductor layers 150 may have at least one of a monocrystalline structure, an amorphous crystalline structure, and a polycrystalline structure.

The common source plate CSP may serve as the common source line CSL of FIG. 3.

Alternatively, each of the horizontal semiconductor layers 150 may include only the common source plate CSP.

Common source lines that extend in a direction D2, instead of two-dimensional (2D) planar common source plates, may be formed in the horizontal semiconductor layers 150.

Filler insulating films (not illustrated) may be formed on the peripheral logic structure PS. The filler insulating films may fill the gaps between the horizontal semiconductor layers 150. The filler insulating films may include, for example, silicon oxide, but the present disclosure is not limited thereto.

A plurality of first through fourth stack structures ST0 through ST3 may be disposed on each of the horizontal semiconductor layers 150. The first through fourth stack structures ST0 through ST3 may be arranged to be spaced apart from one another in a direction D1.

FIG. 4 illustrates that there are four stack structures disposed on each of the horizontal semiconductor layers 150, but the present disclosure is not limited thereto. In some embodiments, two or more stack structures may be disposed on each of the horizontal semiconductor layers 150.

Each of the first through fourth stack structures ST0 through ST3 may include a memory cell array region MCR and a capacitor region FR. The memory cell array region MCR may correspond to the memory cell array 20 of FIG. 1, and the capacitor region FR may correspond to a capacitance region in which a capacitor used in the peripheral circuit 30 is formed.

For example, as illustrated in FIG. 5A, the stack structure ST0 may include a memory cell array region MCR0 (and MCR1) and at least one capacitor region FR0 (e.g., FR0 and FR1).

Referring to FIG. 5A, a capacitor region FR0 may extend in the direction D2 (or a wordline direction) and may be disposed to be a distance D apart from a memory cell array region MCR0 in the direction D1 (or a bitline direction).

Referring to FIG. 5A, the capacitor region FR0 may form a capacitor with a desired and/or alternatively predefined capacitance and may thus be electrically connected to a peripheral circuit for the memory cell array region MCR0.

In another example, as illustrated in FIG. 5B, the stack structure ST0 may include at least two memory cell array regions (MCR0, MCR1, and MCR2) and at least one capacitor region FR1 and FR2.

Referring to FIG. 5B, the capacitor region s FR1 and FR2 may extend in the direction D2 (or a wordline direction) and may be disposed to be a desired and/or alternatively predetermined distance apart from the memory cell array regions MCR0, MCR1, and MCR2 in the direction D1 (or a bitline direction).

Referring to FIG. 5B, the capacitor region FR0 may form a capacitor with a desired and/or alternatively predetermined capacitance and may thus be electrically connected to peripheral circuits for the memory cell array regions MCR0 and MCR1. That is, the memory cell array regions MCR0 and MCR1 are connected to the capacitor in the capacitor region FR0 and can thus be used exclusively.

Referring to FIG. 5B, a capacitor region FR0 may form a capacitor with a desired and/or alternatively predetermined capacitance and may thus be electrically connected to peripheral circuits for the memory cell array region MCR1 and a memory cell array region MCR2. That is, the memory cell array regions MCR1 and MCR2 are connected to the capacitor in the capacitor region FR0 and can thus be used exclusively.

Although not specifically illustrated, a plurality of capacitor region s FR may be provided for a single memory cell region MCR. For example, two capacitor region s, e.g., a first capacitor region "FR A" with a first capacitance and a second capacitor region "FRB" with a second capacitance, may be provided near a single memory cell region MCR to be spaced apart from each other, in which case, the peripheral circuit 30 below the memory cell region MCR may be connected to one of the first and second capacitor region s "FR A" or "FR B", or connected in series or in parallel to both the first and second capacitor region s "FR A" and "FR B", depending on the capacitance required.

A three-dimensional (3D) semiconductor memory device according to some embodiments of the present disclosure will hereinafter be described with reference to FIGS. 6 and 7, taking a stack structure ST1 as an example. The description of the stack structure ST1 that follows may be directly applicable to stack structures ST2, ST3, and ST0.

Referring to FIGS. 6 and 7, the stack structure ST1 includes a memory cell array region MCR and a capacitor region FR. The stack structure ST1 may include a plurality of electrode pads (EP1 through EP7), which are stacked in a direction D3. The stack structure ST1 may further include interlayer insulating films, which are disposed between the electrode pads (EP1 through EP7). The stack structure ST1 is illustrated as including seven electrode pads, but the present disclosure is not limited thereto.

The electrode pads (EP1 through EP7) may include gate electrodes that are included in the string selection transistors (SST1 and SST2) and the ground selection transistor GST. The electrode pads (EP1 through EP7) may further include wordlines of memory cells MCT.

For example, the stack structure ST1 may include fourth and fifth electrode pads EP4 and EP5, which are adjacent to each other in the direction D3. The fifth electrode pad EP5 may be disposed on the fourth electrode pad EP4.

The fourth electrode pad EP4 may protrude in a direction D1 beyond the fifth electrode pad EP5. That is, first sidewalls of the fourth and fifth electrode pads EP4 and EP4 that face a stack structure ST2 may be a desired and/or alternatively predetermined width apart from each other in the direction D1.

The fourth electrode pad EP4 may protrude in a direction D2 beyond the fifth electrode pad EP5. That is, second sidewalls of the fourth and fifth electrode pads EP4 and EP5 may be a desired and/or alternatively predetermined width apart from each other in the direction D2.

In some embodiments, the protruded width, in the direction D1, between the first sidewalls of the fourth and fifth electrode pads EP4 and EP5 may be the same as, or different from, the protruded width, in the direction D2, between the second sidewalls of the fourth and fifth electrode pads EP4 and EP5.

The stack structure ST1 may include a cell region CR and first cell extension regions CER1, which extend in the direction D1, from the cell region CR. The stack structure ST1 may further include second cell extension regions CER2, which extend in the direction D2 from the cell region CR.

A plurality of electrode isolation regions WLC may be disposed in the stack structure ST1. The electrode isolation regions WLC may extend in the direction D2.

The stack structure ST may include a plurality of electrode isolation trenches EST. The electrode isolation regions WLC may fill the electrode isolation trenches EST.

For example, the electrode isolation regions WLC may include an insulating material for filling the electrode isolation trenches EST. The electrode isolation regions WLC may include, for example, silicon oxide.

In another example, the electrode isolation regions WLC may include liners, which are formed along sidewalls of the electrode isolation trenches EST, and filling films, which are disposed on the liners. The liners may include an insulating material, and the filling film may include a conductive material. Alternatively, the liners may include a conductive material, and the filling films may include an insulating material.

In yet another example, the electrode isolation regions WLC may not include an insulating material for filling the electrode isolation trenches EST. The electrode isolation regions WLC may fill the electrode isolation trenches EST with a conductive material.

The electrode isolation regions WLC may not be disposed in the first cell extension regions CER1. The electrode isolation trenches EST, in which the electrode isolation regions WLC are formed, are used in a replacement process for forming the wordlines WL0 through WLn of FIG. 3. That is, parts of a mold film are removed using the electrode isolation trenches EST, and the wordlines WL0 through WLn of FIG. 3 are formed where the mold film is removed.

The mold film may not be entirely removed from the first cell extension regions CER1 of the memory cell region MCR. As a result, the mold film may remain in the first cell extension regions CER1. The first cell extension regions CER1 may include first mold regions EP_M1, which extend in the direction D2. That is, the stack structure ST may include the first mold regions EP_M1, which are disposed on both sides, in the direction D1, of the cell region CR.

In the memory cell array region MCR, each of the electrode pads (EP1 through EP7) may include an electrode region EP_E and first mold regions EP_M1. The electrode region EP_E may include, for example, tungsten (W), but the present disclosure is not limited thereto.

For example, each of the e electrode pads (EP1 through EP7) may include an electrode region EP_E and first mold regions EP_M1, which are disposed on both sides, in the direction D1, of the electrode region EP_E. The electrode region EP_E may be separated by a plurality of electrode isolation regions WLC, which extend in the direction D2. The first mold regions EP_M1 may extend in the direction D1 from the electrode region EP_E.

The plurality of electrode isolation regions WLC may include first and second electrode isolation regions, which are spaced apart from each other in the direction D1. The electrode region EP_E may be disposed between the first and second electrode isolation regions. Part of the electrode region EP_E may be disposed in an area other than that between the first and second electrode isolation regions.

In the memory cell array region MCR, the width, in the direction D1, of the first mold regions EP_M1 of each of the electrode pads (EP1 through EP7) may decrease away from the peripheral logic structure PS in the direction D3. For example, the width, in the direction D1, of the first mold regions EP_M1 of the fourth electrode pad EP4 may be greater than the width, in the direction D1, of the first mold regions EP_M1 of the fifth electrode pad EP5.

For example, in the memory cell array region MCR, first mold regions EP_M1 of the fourth electrode pad EP4 may protrude in the direction D1 beyond first mold regions EP_M1 of the fifth electrode pad EP5 by as much as a desired and/or alternatively predetermined width.

In the memory cell array region MCR, sidewalls of first mold regions EP_M1 of the fourth and fifth electrode pads EP4 and EP5 that face the stack structure ST2 may be a desired and/or alternatively predetermined distance apart from each other in the direction D1.

In the memory cell array region MCR, the sidewall profile of the stack structure ST1 may have a stepwise structure and may be defined by the first mold regions EP_M1 included in each of the electrode pads (EP1 through EP7).

The second cell extension regions CER2 of the memory cell array region MCR may include second mold regions EP_M2. For example, second mold regions EP_M2 of the fourth electrode pad EP4 may protrude in the direction D2 beyond second mold regions EP_M2 of the fifth electrode pad EP5 by as much as a desired and/or alternatively predetermined width.

In the memory cell array region MCR, sidewalls of the second mold regions EP_M2 of the fourth electrode pad EP4 may be a desired and/or alternatively predetermined distance apart from sidewalls of the second mold regions EP_M2 of the fifth electrode pad EP5 in the direction D2.

The first mold regions EP_M1 and the second mold regions EP_M2 may include, for example, silicon nitride, but the present disclosure is not limited thereto.

In the memory cell array region MCR, a plurality of vertical structures VS that penetrate the stack structure ST1 may be disposed between each pair of adjacent electrode isolation regions WLC. The vertical structures VS may be connected to the horizontal semiconductor layers 150.

For example, vertical structures VS that are used as the channel regions of memory cells may be electrically connected to the common source plates CSP of the horizontal semiconductor layers 150.

The vertical structures VS may include a semiconductor material such as, for example, Si, Ge, or a mixture thereof. Alternatively, the vertical structures may include a semiconductor material such as a metal oxide. Each of the vertical structures VS may include a blocking insulating film BIL, a charge storage film CIL, and a tunnel insulating film TIL. The blocking insulating film BIL, the charge storage film CIL, and the tunnel insulating film TIL may be separated from one another at lower parts of the respective vertical structures VS, and a contact supporting film CSB may be disposed between the blocking insulating film BIL, the charge storage film CIL, and the tunnel insulating film TIL. The contact supporting film CSB may electrically connect the common source plates CSP of the horizontal semiconductor layers 150 and the vertical structures VS. The contact supporting film CSB may include a semiconductor material such as, for example, Si, Ge, or a mixture thereof.

In the capacitor region FR, each of the electrode pads (EP1 through EP7) may include an electrode region EP_E and third mold regions. The electrode region EP_E may include, for example, W, but the present disclosure is not limited thereto.

The capacitor region FR may be a distance D apart from the memory cell array region MCR in the direction D1 (or the bitline direction).

In the capacitor region FR, unlike in the memory cell array region MCR, the first cell extension regions CER1 and the second cell extension regions CER2 may not be formed. As illustrated in FIG. 7, in the capacitor region FR, the sidewall profile of the electrode pads (EP1 through EP7) may not have a stepwise structure in the direction D3. For example, the fourth and fifth electrode pads EP4 and EP5 may have the same length in the direction D2. Thus, the length, in the direction D2, of the capacitor region FR, e.g., a width W1 of the capacitor region FR, may be smaller than the length, in the direction D2, of the memory cell array region MCR, e.g., CER2+CR+CER2, and the length, in the direction D1, of the capacitor region FR, e.g., a width W2 of the capacitor region FR, may be smaller than the length, in the direction D1, of the memory cell array region MCR, e.g., CER1+CR+CER1. In other words, the length, in the wordline direction, of the capacitor region FR may be smaller than the length, in the wordline direction, of the memory cell region MCR.

The capacitor region FR may include at least two electrode isolation regions WLC. The distance between the electrode isolation regions WLC in the capacitor region FR may be greater than the distance between electrode isolation regions WLC where there are no through-via structures. For example, the distance between the electrode isolation regions WLC in the capacitor region FR may be three times greater than the distance between electrode isolation regions WLC where there are no through-via structures THV. The distance between electrode isolation regions WLC where there are no through-via structures THV may be the same as the distance between electrode isolation regions WLC where there are, for example, vertical structures VS, e.g., Si.

The capacitor region FR may include a plurality of through-via structures THV between a pair of adjacent electrode isolation regions WLC. The plurality of through-via structures THV may be spaced apart from one another in the direction D2 and may be arranged in at least one row. Alternatively, the plurality of through-via structures THV may be spaced apart from one another in the direction D1 and may be arranged in at least one column. Alternatively, the plurality of through-via structures THV may be spaced apart from one another in both the directions D1 and D2 and may be arranged in at least two rows and at least two columns.

There are two schemes to form the through-via structures THV, e.g., a first scheme in which the through-via structures THV are formed before a replacement process and a second scheme in which the through-via structures THV are formed after a replacement process. In the first scheme, through trenches THV_T are formed between the pair of adjacent electrode isolation regions WLC, the through-via structures THV are formed by depositing an oxide into the through trenches THV_T and injecting a conductive material into the through trenches THV_T, and a replacement process is performed. In the second scheme, a replacement process is performed on the pair of adjacent electrode isolation regions WLC, the through trenches THV_T are formed, and the through-via structures THV are formed by injecting a conductive material into the through trenches THV_T.

The distance between the pair of adjacent electrode isolation regions WLC may be greater in the second scheme than in the first scheme. Since the distance between the pair of adjacent electrode isolation regions WLC is relatively large, there may exist a mold region not filled with a conductive material, in the middle of the pair of adjacent electrode isolation regions WLC.

In the capacitor region FR, the through-via structures THV may be formed by the second scheme. That is, the electrode isolation regions WLC may be used in a replacement process, and the through-via structures THV may be formed after a replacement process using the electrode isolation regions WLC. The through-via structures THV may be disposed to penetrate a mold layer between the pair of adjacent electrode isolation regions WLC. The mold layer may be disposed to extend in the direction D2, between the pair of adjacent electrode isolation regions WLC.

A first interlayer insulating film 151 may be formed on the horizontal semiconductor layers 150. The first interlayer insulating film 151 may cover the stack structures ST1 and ST2 in the memory cell array region MCR and in the capacitor region FR. The first interlayer insulating film 151 may include, for example, silicon oxide, but the present disclosure is not limited thereto.

Second and third interlayer insulating films 152 and 153 may be sequentially formed on the first interlayer insulating film 51. Parts of the electrode isolation regions WLC may extend even to the second interlayer insulating film 152.

Bitlines B1 and through channel contact lines TH_L may be disposed on the stack structure ST1. The bitlines BL may extend in the direction D1. The bitlines BL may be electrically connected to at least one of the vertical structures VS in the direction D1.

The through channel contact lines TH_L may extend in the direction D1. At least one of a plurality of through channel contact lines TH_L included in the stack structure ST0 may be electrically connected to at least one of a plurality of through channel contact lines TH_L included in the stack structure ST1.

The bitlines BL and the through channel contact lines TH_L may be formed on the third interlayer insulating film 153. The bitlines BL may be electrically connected to the vertical structures VS via bitline pads BL_PAD and bitline plugs BL_PG.

Although not specifically illustrated, a plurality of through vias THV_PB may be disposed between the stack structures ST0 and ST1. The through vias THV_PB may be spaced apart from one another in the direction D1.

The through vias THV_PB may be electrically connected to the peripheral circuit TR of the peripheral logic structure PS. The through vias THV_PB may be connected to the bitlines BL via through via connecting wires.

The through vias THV_PB may not penetrate the stack structures ST0 and ST1. The through vias THV_PB may penetrate the space between the stack structures ST0 and ST1 and may thus be electrically connected to the peripheral circuit TR.

FIGS. 8A through 10C are enlarged views illustrating part Y of the capacitor region FR of the semiconductor memory device of FIG. 6.

Figure 8A:
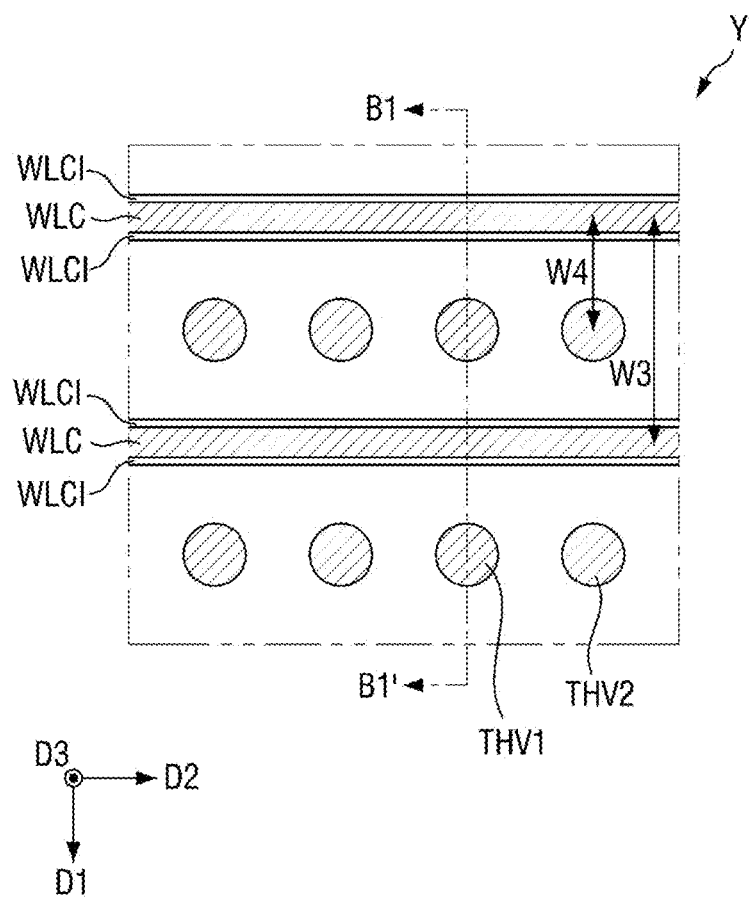
FIG. 8A illustrates the part Y of a capacitor region FR of the semiconductor memory device of FIG. 6.
Figure 8B:
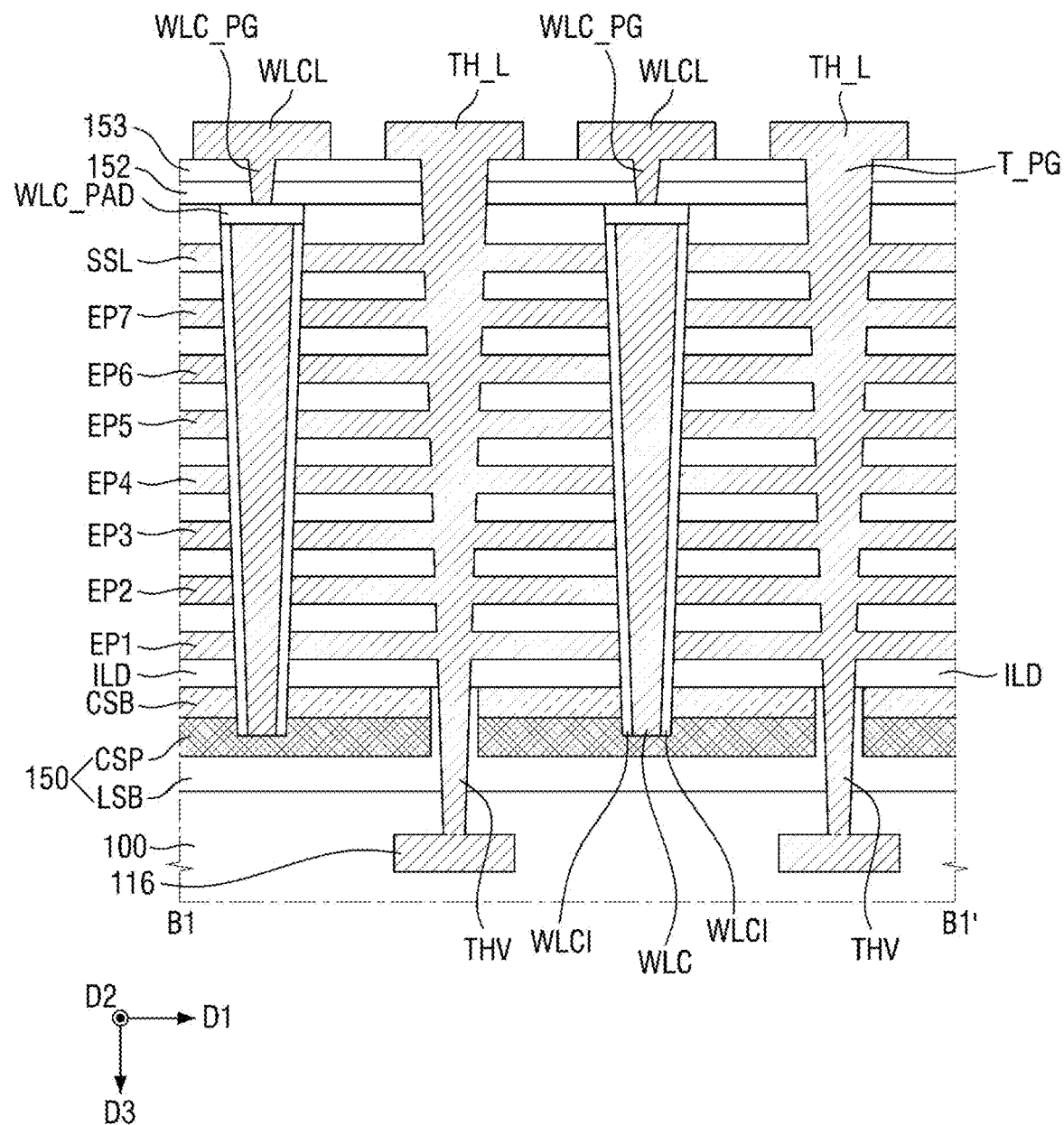
FIG. 8B is a cross-sectional view taken along line B1-B1' of FIG. 8A

Specifically, FIG. 8A illustrates the part Y of the capacitor region FR of the semiconductor memory device of FIG. 6, and FIG. 8B is a cross-sectional view taken along line B1-B1' of FIG. 8A. For convenience, FIGS. 8A and 8B illustrate through-via structures THV that are arranged in a row, between a pair of adjacent electrode isolation regions WLC, to be spaced at regular intervals in the direction D1, but the present disclosure is not limited thereto. The present disclosure may also be applicable to through-via structures THV that are arranged in multiple rows between the pair of adjacent electrode isolation regions WLC.

Referring to FIGS. 8A and 8B, the semiconductor memory device of FIG. 6 may include, in the capacitor region FR, at least two electrode isolation regions WLC, which are adjacent to each other, and a plurality of through-via structures THV, which are disposed between the electrode isolation regions WLC to be spaced apart from one another in the direction D2.

The capacitor region FR may include the electrode isolation regions WLC and the through-via structures THV. In each of the electrode isolation regions WLC, a conductive pattern and spacers WLCI, which surround both sides of the conductive pattern, may be formed. The electrode isolation regions WLC may extend in the directions D2 and D3 and may be spaced apart from each other in the direction D1 by as much as a width W3. First sides of the conductive patterns of the electrode isolation regions WLC may be connected to electrode isolation region contact lines WLCL via electrode isolation region plugs WLC_PG and electrode isolation pads WLC_PD, and second sides of the conductive patterns of the electrode isolation regions WLC may be connected to the common electrode plates CSP of the horizontal semiconductor layers 150.

The through-via structures THV may be arranged in at least one row, between the electrode isolation regions WLC, to be spaced at regular intervals in the direction D2. The through-via structures THV may be disposed to be a width W4 apart in the direction D1 from the electrode isolation regions WLC. First sides of the through-via structures THV may be connected to the through channel contact lines TH_L, and second sides of the through-via structures THV may be connected to wiring lines 116 in the peripheral logic structure PS.

If a first voltage is applied via the through channel contact lines TH_L, the electrode pads (EP1 through EP7) may be bonded to the through-via structures THV with no through insulating film THI. For example, the first voltage may be an input power supply voltage VDD or a ground voltage GND.

Since the electrode isolation regions WLC are electrically disconnected from the electrode pads (EP1 through EP7) due to the spacers WLCI, a second voltage may be applied via the electrode isolation region contact lines WLCL. For example, the second voltage may be the ground voltage GND or the input power supply voltage VDD.

In response to the first and second voltages, which are different, being applied, capacitors may be generated between the conductive patterns of the electrode isolation regions WLC and the electrode pads (EP1 through EP7). The capacitors may increase as the number of electrode pads that are stacked increases. The capacitors may be connected to the peripheral circuit TR via the wiring lines 116.

Figure 9A:
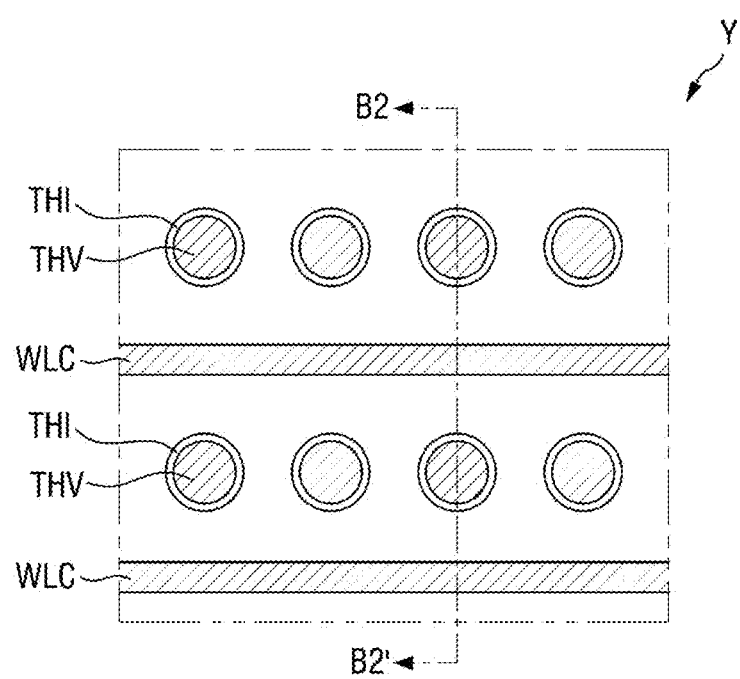
FIG. 9A illustrates a peripheral region of a semiconductor memory device according to some embodiments of the present disclosure.
Figure 9A:
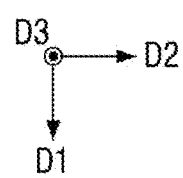
Figure 9B:
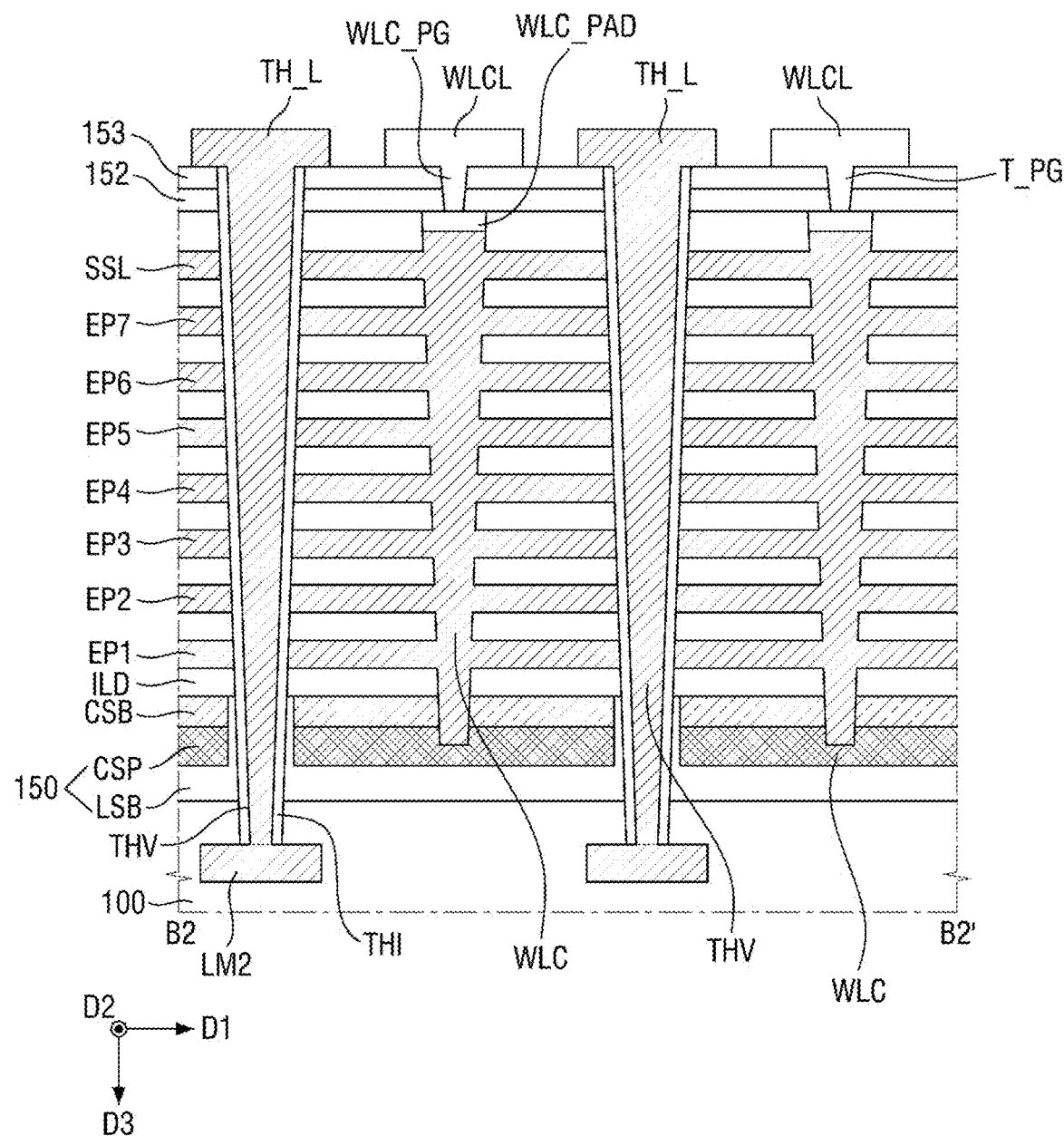
FIG. 9B is a cross-sectional view taken along line B2-B2' of FIG. 9A.

FIG. 9A illustrates a capacitor region of a semiconductor memory device according to some embodiments of the present disclosure, and FIG. 9B is a cross-sectional view taken along line B2-B2' of FIG. 9A.

Referring to FIGS. 9A and 9B, the semiconductor memory device may include, in a capacitor region FR, at least two electrode isolation regions WLC, which are adjacent to each other, and a plurality of through-via structures THV, which are disposed between the electrode isolation regions WLC to be spaced apart from one another in a direction D2.

The capacitor region FR may include the electrode isolation regions WLC and the through-via structures THV. Conductive patterns may be formed in the electrode isolation regions WLC. The electrode isolation regions WLC may extend in the direction D2 and a direction D3 and may be spaced apart from each other in a direction D1 by as much as a width W3. First sides of the conductive patterns of the electrode isolation regions WLC may be connected to electrode isolation region contact lines WLCL via electrode isolation region contact plugs WLC_PG and electrode isolation pads WLC_PD, and second sides of the conductive patterns of the electrode isolation regions WLC may be connected to common electrode plates CSP of horizontal semiconductor layers 150.

Through-via structures THV may be arranged in at least one row, between the electrode isolation regions WLC, to be spaced at regular intervals in the direction D2. The through-via structures THV may be disposed to be a width W4 apart in the direction D1 from the electrode isolation regions WLC. First sides of the through-via structures THV may be connected to through channel contact lines TH_L, and second sides of the through-via structures THV may be connected to wiring lines 116 in a peripheral logic structure PS. The through-via structures THV of FIGS. 9A and 9B, unlike the through-via structures THV of FIGS. 8A and 8B, include conductive regions THV and through insulating films THI, which surround the conductive regions THV.

In response to a first voltage being applied to the through channel contact lines TH_L and a second voltage, which is different from the first voltage, being applied to the electrode isolation region contact lines WLCL, capacitors are generated between the conductive patterns of the electrode isolation regions WLC. The capacitors may increase as the number of electrode pads that are stacked increases. The capacitors may be connected to a peripheral circuit TR via wiring lines 116.

Figure 10A:
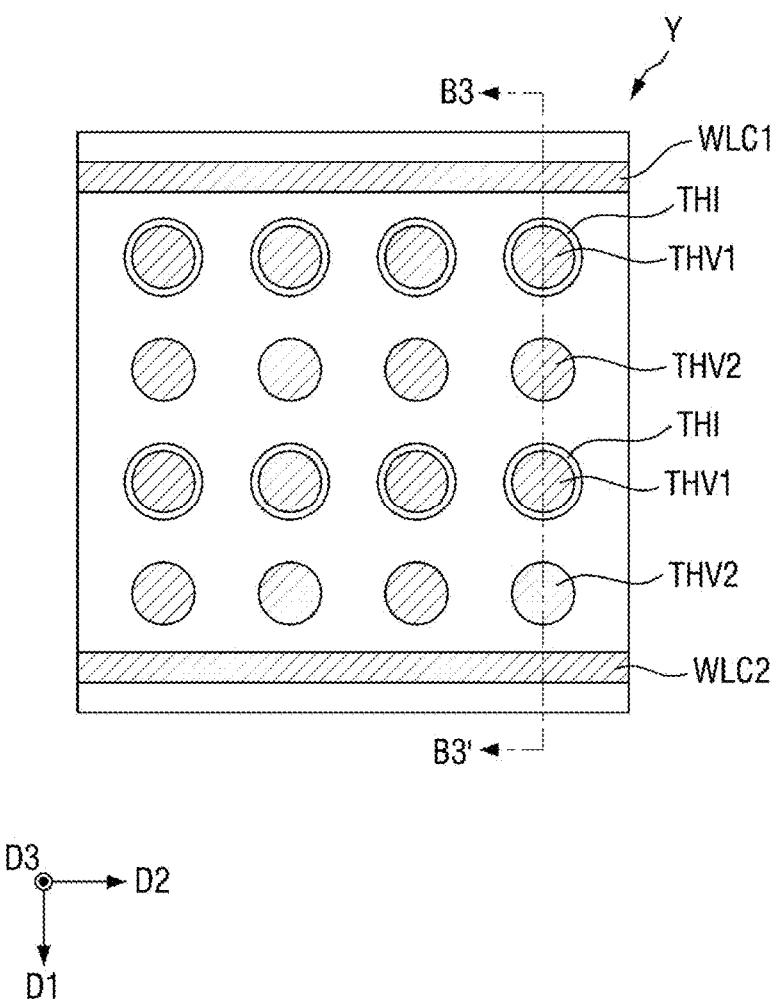
FIG. 10A illustrates a capacitor of a semiconductor memory device according to some embodiments of the present disclosure.
Figure 10B:
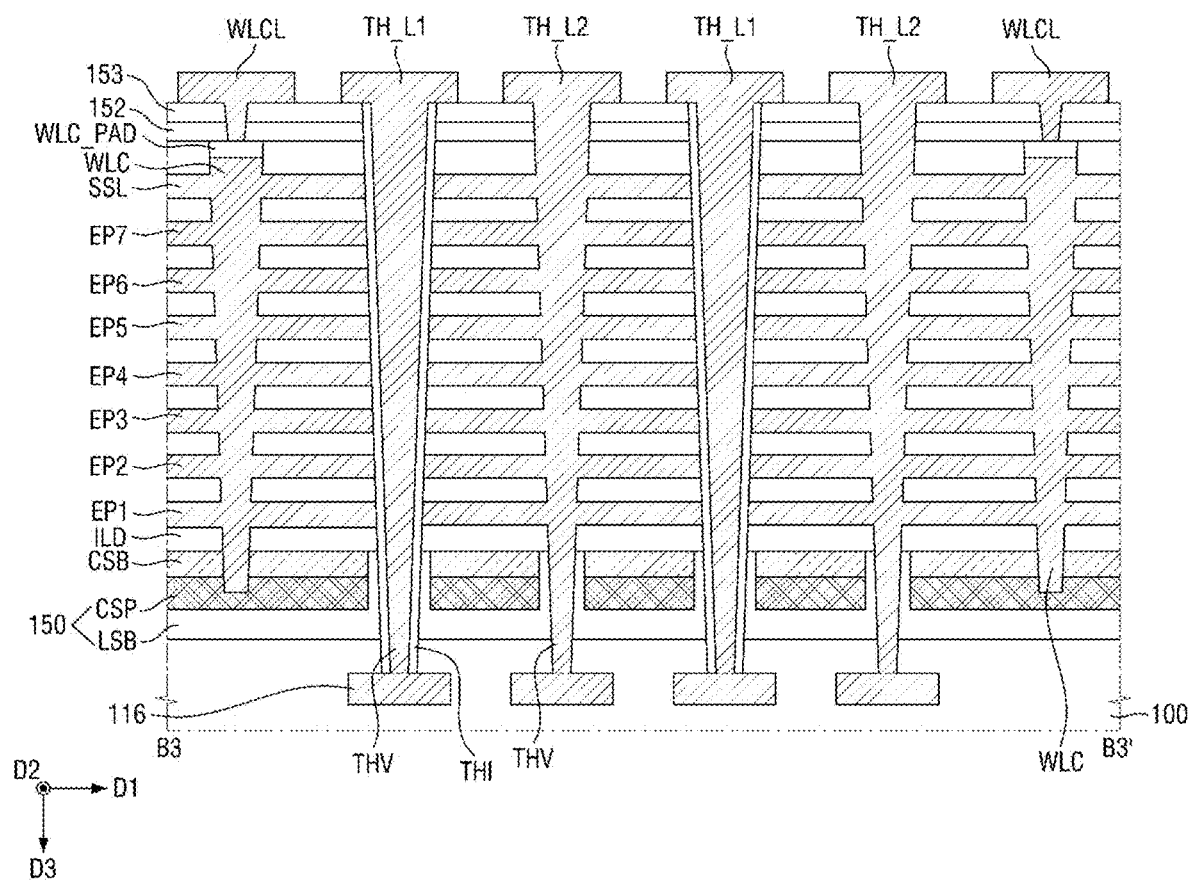
FIGS. 10B and 10C are cross-sectional views taken along line B3-B3' of FIG. 10A.
Figure 10C:
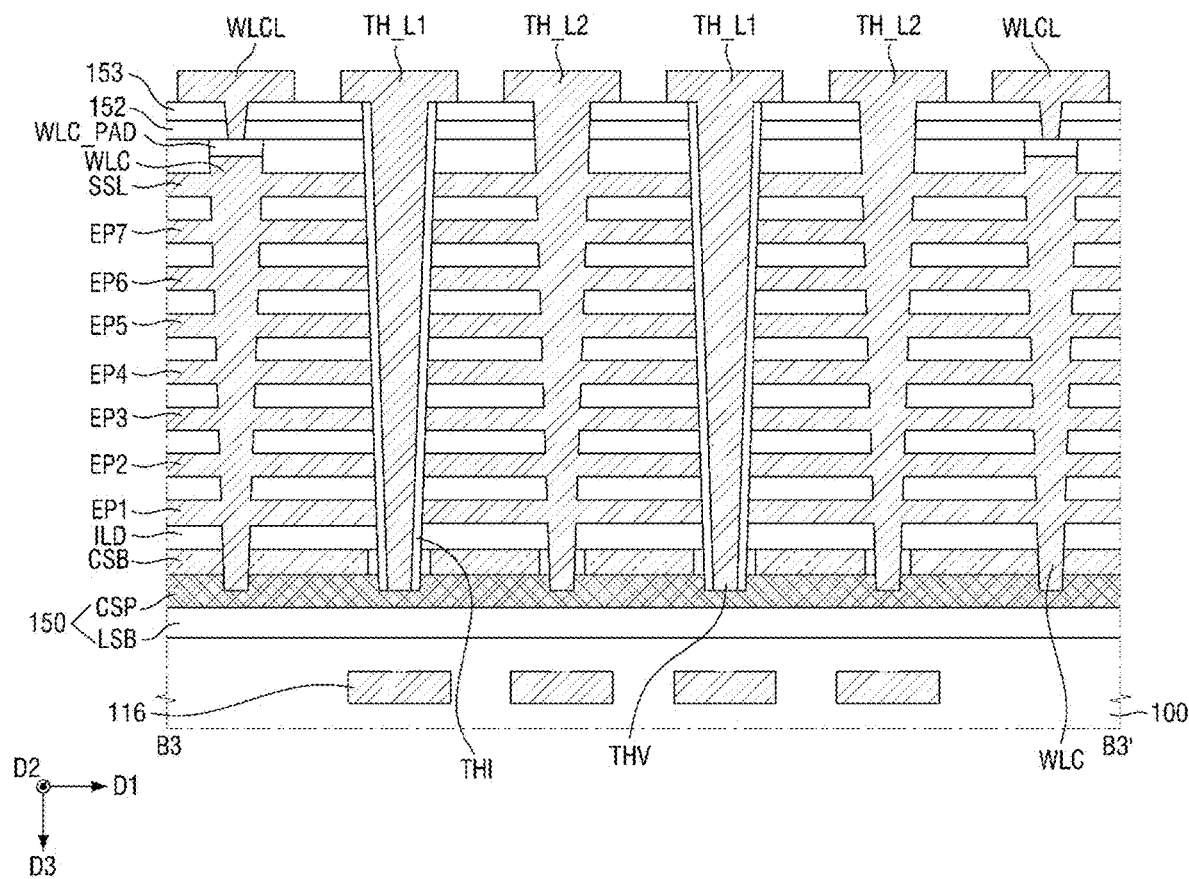

FIG. 10A illustrates a capacitor region of a semiconductor memory device according to some embodiments of the present disclosure, and FIGS. 10B and 10C are cross-sectional views taken along line B3-B3' of FIG. 10A.

Referring to FIGS. 10A and 10B, the semiconductor memory device may include, in a capacitor region FR, at least two electrode isolation regions WLC, which are adjacent to each other, and a plurality of through-via structures THV, which are disposed between the electrode isolation regions WLC to be spaced apart from one another in directions D1 and D2.

The through-via structures THV may include first through-via structures THV1 and second through-via structures THV1. The first through-via structures THV1 may include conductive regions and through insulating films THI, which surround the conductive regions, and the second through-via structures THV2 may include only conductive regions. The first through-via structures THV1 and the second through-via structures THV2 may be alternately arranged.

In some embodiments, first and third rows of first through-via structures THV1 and second and fourth rows of second through-via structures THV2 may be provided to be spaced apart from one another in the direction D1.

Although not specifically illustrated, in some embodiments, rows of first through-via structures THV1 and rows of second through-via structures THV2 may be alternately arranged. For example, two rows of first through-via structures THV1 and two rows of second through-via structures THV2 may be alternately arranged.

Although not specifically illustrated, in some embodiments, at least one column of first through-via structures THV1 and at least one column of second through-via structures THV2 may be alternately arranged.

The distance between the electrode isolation regions WLC may be greater than the width W3 of FIG. 8A or 9A.

First sides of the conductive patterns of the electrode isolation regions WLC may be connected to electrode isolation region contact lines WLCL via electrode isolation region contact plugs WLC_PG and electrode isolation pads WLC_PD, and second sides of the conductive patterns of the electrode isolation regions WLC may be connected to common electrode plates CSP of horizontal semiconductor layers 150.

Referring to FIG. 10B, in some embodiments, the through-via structures THV may be arranged in at least one row and at least one column, between the electrode isolation regions WLC, to be spaced at regular intervals in the direction D2. The through-via structures THV may also be spaced at regular intervals in the direction D1, between the electrode isolation regions WLC. First sides of the first through-via structures THV1 and first sides of the second through-via structures THV2 may be connected first through channel contact lines TH_L and second through channel contact lines TH_L2, respectively, and second sides of the first through-via structures THV1 and second sides of the second through-via structures THV2 may be connected to wiring lines 116 in a peripheral logic structure PS.

In response to a first voltage being applied to the first through channel contact lines TH_L and a second voltage, which is different from the first voltage, being applied to the second through channel contact lines TH_L2, the second voltage is applied to electrode pads (EP1 through EP7) that are stacked, via the second through channel contact lines THL_2. That is, capacitors may be generated between the first through-via structures THV1 and the electrode pads (EP1 through EP7). The capacitors may be connected to a peripheral circuit TR via the wiring lines 116.

Referring to FIG. 10C, in some embodiments, through-via structures THV may be arranged in at least one row and at least one column, between the electrode isolation regions WLC, to be spaced at regular intervals in the direction D2. The through-via structures THV may also be spaced at regular intervals in the direction D1, between the electrode isolation regions WLC. First sides of the first through-via structures THV1 and first sides of the second through-via structures THV2 may be connected first through channel contact lines TH_L and second through channel contact lines TH_L2, respectively, and second sides of the first through-via structures THV1 and second sides of the second through-via structures THV2 may be connected to common electrode plates CSP of horizontal semiconductor layers 150.

In response to a first voltage being applied to the first through channel contact lines TH_L and a second voltage, which is different from the first voltage, being applied to the second through channel contact lines TH_L2, the second voltage is applied to electrode pads (EP1 through EP7) that are stacked, via the second through channel contact lines THL_2. That is, capacitances of capacitors may be generated between the first through-via structures THV1 and the electrode pads (EP1 through EP7). Also, capacitances of capacitors may be additionally generated between the common source plates CSP and lowermost interlayer insulating films ILD. The capacitors generated between the first through-via structures THV1 and the electrode pads (EP1 through EP7) may be connected to a peripheral circuit TR via the common source plates CSP.

Although not specifically illustrated, the semiconductor memory device may include, in the capacitor region FR, a plurality of electrode isolation regions WLC, and the electrode isolation regions WLC may include first electrode isolation regions WLC1, which include conductive patterns and spacers that surround the conductive patterns, and second electrode isolation regions WLC2, which include conductive patterns. The first electrode isolation regions WLC1 and the second electrode isolation regions WLC2 may be alternately arranged in the direction D1.

In some embodiments, first sides of the first electrode isolation regions WLC1 may be connected to first electrode isolation region contact lines WLCL1, second sides of the first electrode isolation regions WLC1 may be connected to the common source plates CSP, first sides of the second electrode isolation regions WLC2 may be connected to second electrode isolation region contact lines WLCL2, and second sides of the second electrode isolation regions WLC2 may be connected to the wiring lines 116. In response to the first and second voltages, which are different from each other, being applied to the first electrode isolation region contact lines WLCL1 and the second electrode isolation region contact lines WLCL2, respectively, the second voltage is applied to the electrode pads (EP1 through EP7) via the second electrode isolation regions WLC2. As a result, capacitors may be formed between the first electrode isolation regions WCL1 and the electrode pads (EP1 through EP7). The capacitors may be used in the peripheral circuit TR as capacitors via the wiring lines 116.

In some embodiments, the first sides of the first electrode isolation regions WLC1 may be connected to the first electrode isolation region contact lines WLCL1, the second sides of the first electrode isolation regions WLC1 may be connected to the common source plates CSP, the first sides of the second electrode isolation regions WLC2 may be connected to the second electrode isolation region contact lines WLCL2, and the second sides of the second electrode isolation regions WLC2 may be connected to the common source plates CSP. In response to the first and second voltages, which are different from each other, being applied to the first electrode isolation region contact lines WLCL1 and the second electrode isolation region contact lines WLCL2, respectively, the second voltage is applied to the electrode pads (EP1 through EP7) via the second electrode isolation regions WLC2. As a result, capacitors may be formed between the first electrode isolation regions WCL1 and the electrode pads (EP1 through EP7). The capacitors may be used in the peripheral circuit TR as capacitors via the common source plates CSP.

Figure 11:
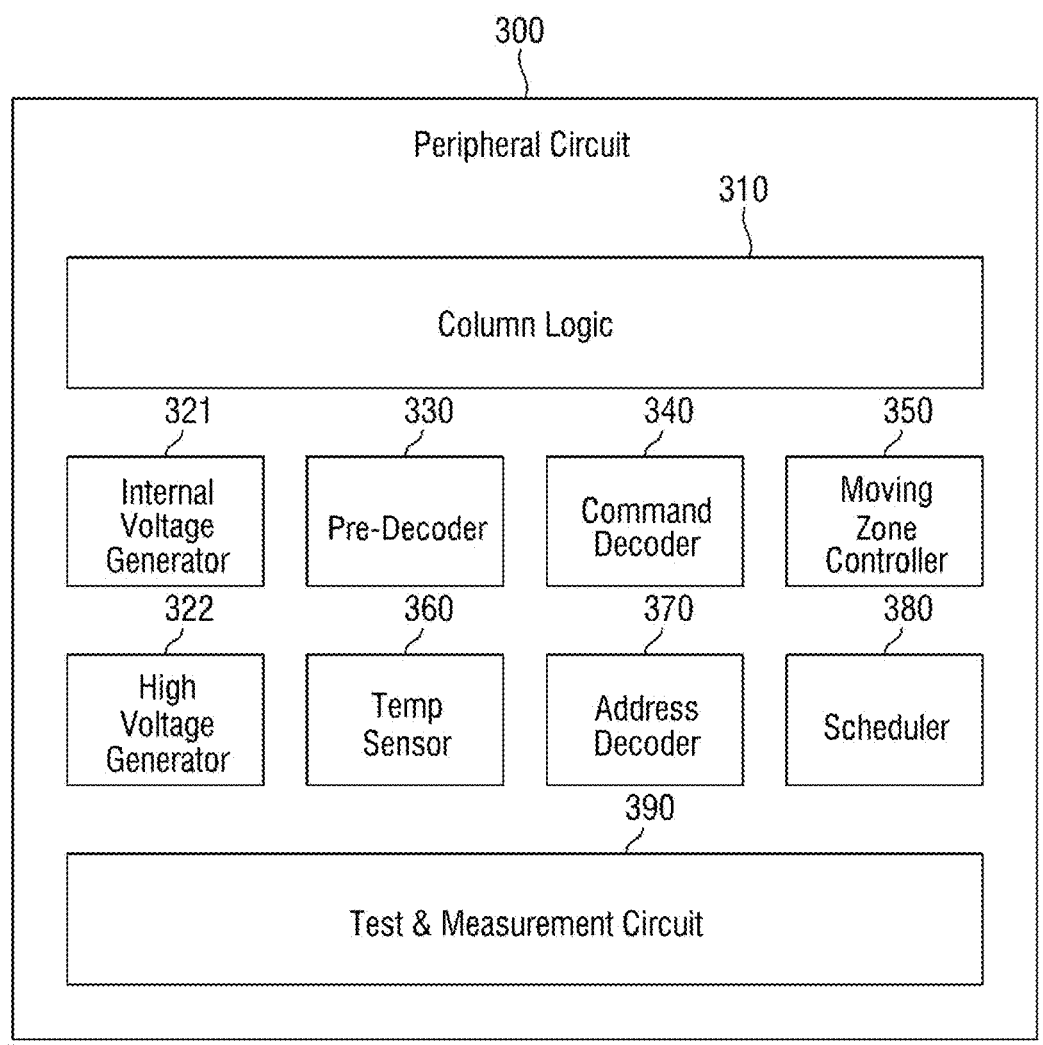
FIG. 11 is a block diagram of an example peripheral circuit of FIG. 1.

FIG. 11 is a block diagram of an example peripheral circuit of FIG. 1.

In some embodiments, capacitors generated between at least some through-via structures (or at least some electrode isolation regions) and the electrode patterns of stack structures may serve as capacitors in the peripheral circuit 30 included in the semiconductor memory device 10 of FIG. 1. For example, at least some through-via structures (or at least some electrode isolation regions) may consist of the first electrodes of capacitors, and the electrode patterns of the stack structures may consist of the second electrodes of the capacitors.

Referring to FIG. 11, an example peripheral circuit 300 may include a column logic 310, an internal voltage generator 321, a high voltage generator 322, a pre-decoder 330, a temperature sensor 340, a command decoder 350, an address decoder 360, a moving zone controller 370, a scheduler 380, and a test/measurement circuit 390. The column logic 310, internal voltage generator 321, high voltage generator 322, pre-decoder 330, temperature sensor 340, command decoder 350, address decoder 360, moving zone controller 370, scheduler 380, and test/measurement circuit 390 may be implemented with processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The column logic 310 may operate in response to control signals, commands CMD, or instructions input thereto from an external source (e.g., host, not shown) and may be configured to access the semiconductor memory device 10 in FIG. 1 and/or peripheral circuit 300 and control operations of the semiconductor memory device 10 and/or peripheral circuit 300 discussed herein, thereby transforming column logic 310 into a special purpose column logic 310.

The configuration of the peripheral circuit 300 of FIG. 11 is example, and the peripheral circuit 300 may additionally include elements other than those illustrated in FIG. 11 or may have a different configuration from that illustrated in FIG. 11. The peripheral circuit 300 will hereinafter be described with reference to FIGS. 1 and 11.

The column logic 310 may generate a signal for driving the page buffer 35. The pre-decoder 330 may generate a signal for determining the timing of a signal for driving the row decoder 33. The internal voltage generator 321 may generate voltages for use in the semiconductor memory device 10, such as, for example, voltages applied to the wordlines WL and the bitlines BL, reference voltages, and power supply voltages. The high voltage generator 322 may include a charge pump, a regulator, and the like and may generate high voltages for programming or erasing the memory cells of the memory cell array 20. The temperature sensor 340 may detect the temperature of the semiconductor memory device 10 and may output a signal corresponding to the detected temperature.

The command decoder 350 may latch and decode a command signal CMD received from outside the semiconductor memory device 10 and may set an operating mode for the semiconductor memory device 10 based on the decoded command signal. The address decoder 360 may latch and decode an address signal ADDR received from outside the semiconductor memory device 10 and may activate a memory block selected in accordance with the decoded address signal. The moving zone controller 370 may control the application of various voltages to strings included in the memory cell array 20. The scheduler 380 may include a processor or a state machine and may generate a plurality of control signals at appropriate timings in accordance with the operating mode set by the command decoder 350. The test/measurement circuit 390 may test or measure the characteristics of the semiconductor memory device 10 to provide information regarding the characteristics of the semiconductor memory device 10 during the fabrication of the semiconductor memory device 10. The test/measurement circuit 390 may operate in accordance with the command signal CMD. A system including the semiconductor memory device 10 may use the test/measurement circuit 390 to acquire the information regarding the characteristics of the semiconductor memory device 10 at an early stage of operation.

The elements of the peripheral circuit 300 may be disposed in the peripheral logic structure PS of FIG. 2, together with the row decoder 33 and the page buffer 35 of FIG. 1.

Figure 12:
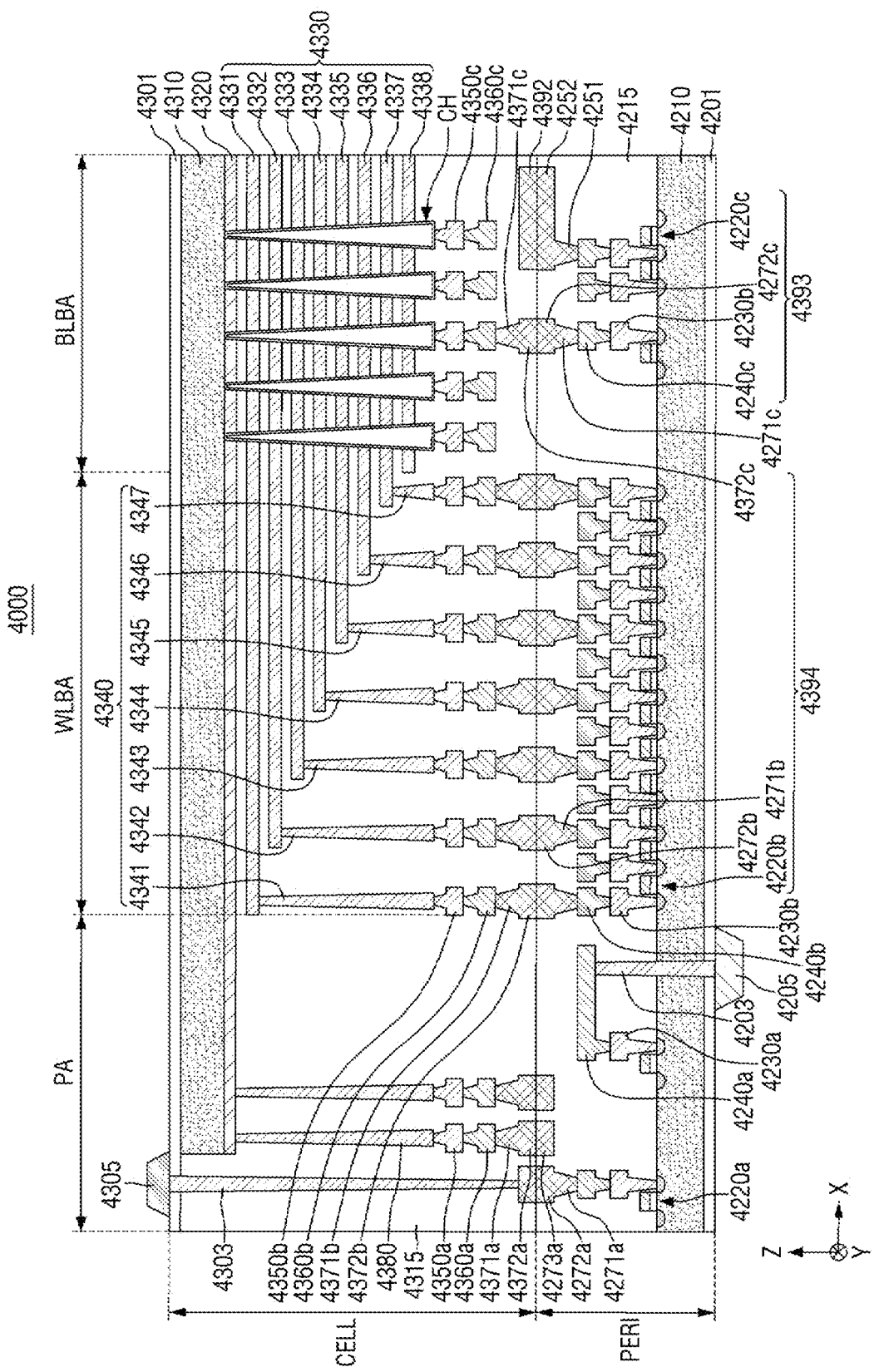
FIG. 12 is a sectional view of a memory cell region in a semiconductor memory device according to some embodiments of the present disclosure.
Figure 13:
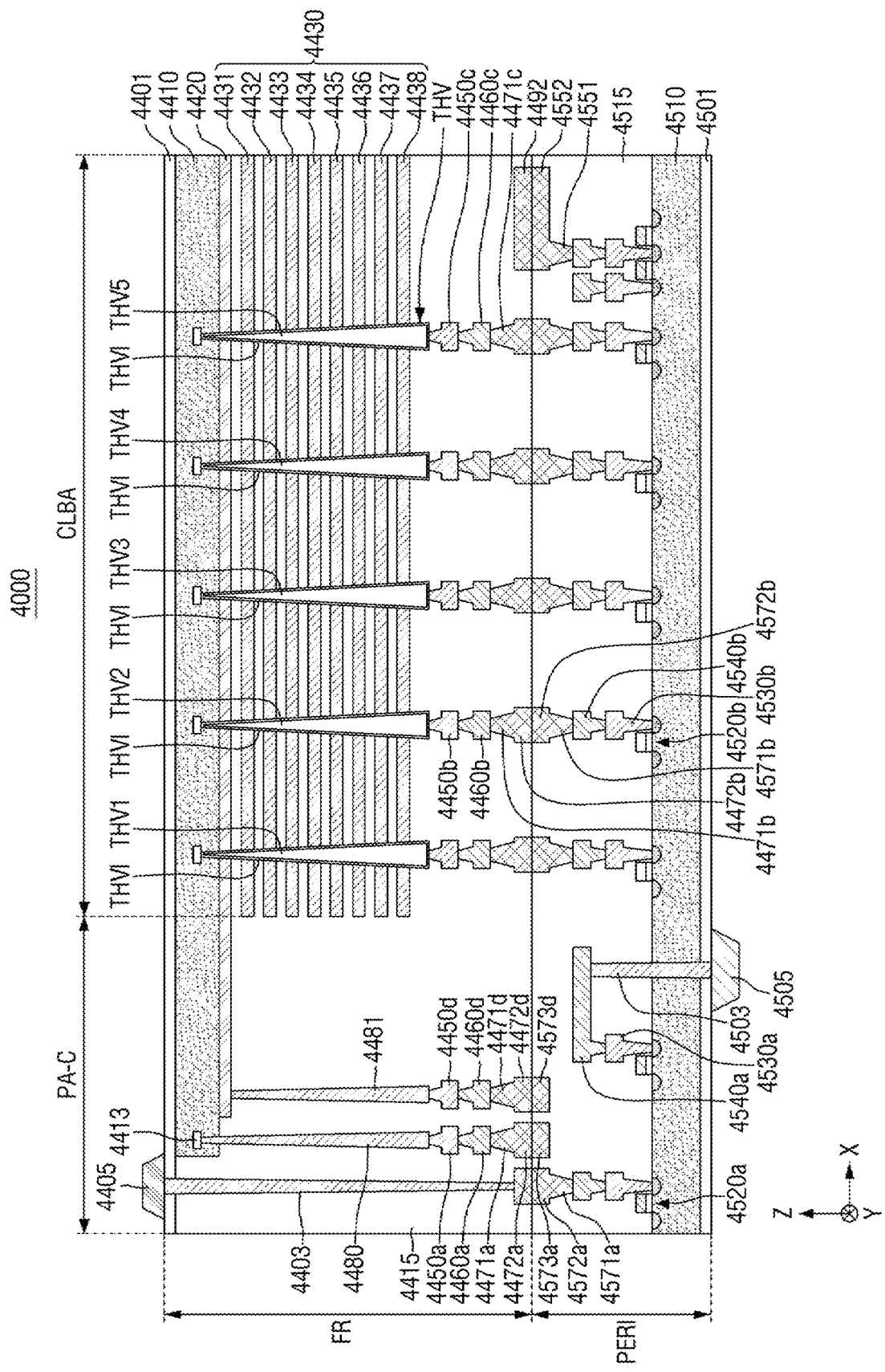
FIG. 13 is a sectional view of a capacitor region in a semiconductor memory device according to some embodiments of the present disclosure.

FIG. 12 is a sectional view of a memory cell region in a semiconductor memory device according to some embodiments of the present disclosure and FIG. 13 is a sectional view of a capacitor region in a semiconductor memory device according to some embodiments of the present disclosure.

The memory cell region illustrated in FIG. 12 may be the memory cell region MCR described in FIGS. 5A to 6. The capacitor region illustrated in FIG. 13 may be the capacitor region FR described in FIGS. 5A to 6.

Referring to FIG. 12 and FIG. 13, a memory device 4000 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

In the memory cell region MCR, each of the peripheral circuit region PERI and the cell region CELL of the memory device 4000 may include an external pad bonding area PA, a word line bonding area WLBA, and a bit line bonding area BLBA. The peripheral circuit region PERI is one example of FIG. 11 and the cell region CELL is one example of the memory device described in FIGS. 1 to 10.

In the capacitor cell region FR, each of the peripheral circuit region PERI and the capacitor region FR of the memory device 40 may include an external pad bonding area PA-C, and a through via bonding area CLBA.

The peripheral circuit region PERI may include a first substrate 4210, 4510, an interlayer insulating layer 4215, 4515, a plurality of circuit elements 4220a, 4220b, and 4220c, 4520a, 4520b formed on the first substrate 4210, 4510, first metal layers 4230a, 4230b, 4230c, 4530a, 4530b respectively connected to the plurality of circuit elements 4220a, 4220b, 4220c, 4520a, 4520b and second metal layers 4240a, 4240b, 4240c, 4540a, 4540b formed on the first metal layers 4230a, 4230b, 4230c, 4530a, 4530b. In an example embodiment, the first metal layers 4230a, 4230b, 4230c, 4530a, 4530b may be formed of tungsten having relatively high resistance, and the second metal layers 4240a, 4240b, 4240c, 4540a, 4540b may be formed of copper having relatively low resistance.

In an example embodiment illustrate in FIG. 12 and FIG. 13, although the first metal layers 4230a, 4230b, 4230c, 4530a, 4530b and the second metal layers 4240a, 4240b, 4240c, 4540a, 4540b are shown and described, they are not limited thereto, and one or more metal layers may be further formed on the second metal layers 4240*a*, 4240*b*, 4240*c*, 4540*a*, 4540*b*. At least a portion of the one or more metal layers formed on the second metal layers 4240*a*, 4240*b*, 4240*c*, 4540*a*, 4540*b* may be formed of aluminum or the like having a lower resistance than those of copper forming the second metal layers 4240*a*, 4240*b*, 4240*c*, 4540*a*, and 4540*b*.

The interlayer insulating layer 4215, 4515 may be disposed on the first substrate 4210, 4510 and cover the plurality of circuit elements 4220*a*, 4220*b*, 4220*c*, 4520*a* and 4520*b*, the first metal layers 4230*a*, 4230*b*, 4230*c*, 4530*a* and 4530*b* and the second metal layers 4240*a*, 4240*b*, 4240*c*, 4540*a*, 4540*b*. The interlayer insulating layer 4215, 4515 may include an insulating material such as silicon oxide, silicon nitride, or the like.

Lower bonding metals 4271*b*, 4272*b*, 4571*b* and 4572*b* may be formed on the second metal layer 4240*b*, 4540*b* in the word line bonding area WLBA or the through-via bonding area CLBA. In the word line bonding area WLBA of FIG. 12, the lower bonding metals 4271*b* and 4272*b* in the peripheral circuit region PERI may be electrically connected to upper bonding metals 4371*b* and 4372*b* in the cell region CELL in a bonding manner, and the lower bonding metals 4271*b* and 4272*b* and the upper bonding metals 4371*b* and 4372*b* may be formed of aluminum, copper, tungsten, or the like. In the through via bonding area CLBA of FIG. 13, the lower bonding metals 4571*a* and 4572*b* in the peripheral circuit region PERI may be electrically connected to upper bonding metals 4471*b* and 4472*b* in the capacitor region FR in a bonding manner, and the lower bonding metals 4571*b* and 4572*b* and the upper bonding metals 4471*b* and 4472*b* may be formed of aluminum, copper, tungsten, or the like.

The cell region CELL may include at least one memory block. The cell region CELL may include a second substrate 4310 and a common source line 4320. On the second substrate 4310, a plurality of word lines 4331 to 4338 (i.e., 4330) may be stacked in a direction (a Z-axis direction), perpendicular to an upper surface of the second substrate 4310. At least one string select line and at least one ground select line may be arranged on and below the plurality of word lines 4330, respectively, and the plurality of word lines 4330 may be disposed between the at least one string select line and the at least one ground select line.

In the bit line bonding area BLBA, a channel structure CH may extend in a direction, perpendicular to the upper surface of the second substrate 4310, and pass through the plurality of word lines 4330, the at least one string select line, and the at least one ground select line. The channel structure CH may include a data storage layer, a channel layer, a buried insulating layer, and the like, and the channel layer may be electrically connected to a first metal layer 4350*c* and a second metal layer 4360*c*. For example, the first metal layer 4350*c* may be a bit line contact, and the second metal layer 4360*c* may be a bit line. In an example embodiment, the bit line 4360*c* may extend in a first direction (a Y-axis direction), parallel to the upper surface of the second substrate 4310.

The capacitor region FR may include at least one stack structure. The capacitor region FR may include a second substrate 4410 and a horizontal semiconductor layer 4420. On the second substrate 4410, a plurality of electrode pads 4431 to 4438 (i.e., 4430) may be stacked in a direction (a Z-axis direction) perpendicular to an upper surface of the second substrate 4410. The electrode pads 4430 may be disposed to be coplanar with the electrode pads of the word lines and may be disposed to be independently spaced apart from each other on each layer, as described in FIGS. 5A to 6. The stack structures 4430 may be disposed between the horizontal semiconductor layer 4420 and through channel contact lines 4450*b* and 4450*c*.

In the capacitor region FR, the stack structures 4430 may include at least one through-via structure THV and at least one electrode isolation region WLC. The through-via structure THV may extend in the direction (the Z-axis direction) perpendicular to the upper surface of the second substrate 4410 and pass through the electrode pads 4430 and the horizontal semiconductor layer 4420. In some embodiments, through-via structures THV1 to THV5 may include conductive regions THV and through insulating films THI which surround the conductive regions. Each of the through-via structures THV1 to THV5 may have a first side connected to the through channel contact lines 4450*b* and 4450*c* and a second side connected to any one of interconnection lines 4415 under the horizontal semiconductor layer 4420. The through-via structures THV1 to THV5 may be disposed between at least two electrode isolation regions WLC to be spaced a predetermined distance from each other in the Y-axis direction, and the through-via structures THV1 to THV5 may be disposed to be spaced a predetermined distance from each other in an X-axis direction.

The interconnection lines 4415 may be connected to peripheral circuits of the first substrate 4510 through first connection contact plugs 4480. The first connection contact plugs 4480 may be formed in a vertical direction (the Z-axis direction) from the external pad bonding area PA-C and each may have a first side connected to the wiring line 4415 and a second side connected to a first metal layer 4450*a*. The first metal layer 4450*a* and a second metal layer 4460*a* may be sequentially stacked and connected to an upper bonding metal 4471*a* and an upper metal pattern 4472*a*. The upper bonding metal 4471*a* and the upper metal pattern 4472*a* may be connected to a lower metal pattern 4573*a* disposed on an uppermost metal layer in the peripheral circuit region PERI and having the same shape as the upper metal pattern 4472*a*. Although not illustrated, the lower metal pattern 4573*a* in the peripheral circuit region PERI may be electrically connected to any one element.

Second connection contact plugs 4481 may be formed in the vertical direction (the Z-axis direction) from the external pad bonding area PA-C and each may have a first side connected to the horizontal semiconductor layer 4420 and a second side connected to a first metal layer 4450*d*. The first metal layer 4450*d* and a second metal layer 4460*d* may be sequentially stacked and connected to an upper bonding metal 4471*d* and an upper metal pattern 4472*d*. The upper bonding metal 4471*d* and the upper metal pattern 4472*d* may be connected to a lower metal pattern 4573*d* disposed on the uppermost metal layer in the peripheral circuit region PERI and having the same shape as the upper metal pattern 4472*d*. Although not illustrated, the lower metal pattern 4573*d* in the peripheral circuit region PERI may be electrically connected to any one element.

The electrode isolation regions WLC may extend in the X-axis direction and the Z-axis direction and, in each of the electrode isolation regions WLC, conductive patterns and spacers WLCI which surround the conductive patterns may be formed. The electrode isolation regions WLC may be disposed in the Y-axis direction to be spaced a predetermined distance from each other. Each of the conductive patterns in the electrode isolation regions may have a first side connected to electrode isolation region contact lines WLCL through electrode isolation region plugs WLC_PG and electrode isolation pads WLC_PD and a second side connected to a common electrode plate CSP. Although the electrode isolation regions are not illustrated, the electrode isolation regions may be implemented as described in FIGS. 5A to 10C.

When a first voltage is applied to the through channel contact lines 4450b and 4450c and a second voltage different from the first voltage is applied to the electrode isolation region contact lines WLCL, capacitors may be formed between the electrode pads 4430 and the conductive regions THV based on the through insulating film THI and between the conductive patterns WLC and the electrode pads 4430 in the electrode isolation region based on the spacers WLCI. The capacity of the capacitors may be increased by the number of stacked electrode pads. The capacitors may be connected to the peripheral circuit elements in the peripheral region PERI through the interconnection lines 4415.

In an example embodiment illustrated in FIG. 12, an area in which the channel structure CH, the bit line 4360c, and the like are disposed may be defined as the bit line bonding area BLBA. In the bit line bonding area BLBA, the bit line 4360c may be electrically connected to the circuit elements 4220c providing a page buffer 4393 in the peripheral circuit region PERI. For example, the bit line 4360c may be connected to upper bonding metals 4371c and 4372c in the cell region CELL, and the upper bonding metals 4371c and 4372c may be connected to lower bonding metals 4271c and 4272c connected to the circuit elements 4220c of the page buffer 4393.

In the word line bonding area WLBA, the plurality of word lines 4330 may extend in a second direction (an X-axis direction), parallel to the upper surface of the second substrate 4310, and may be connected to a plurality of cell contact plugs 4341 to 4347 (i.e., 4340). The plurality of word lines 4330 and the plurality of cell contact plugs 4340 may be connected to each other in pads provided by at least a portion of the plurality of word lines 4330 extending in different lengths in the second direction. A first metal layer 4350b and a second metal layer 4360b may be connected to an upper portion of the plurality of cell contact plugs 4340 connected to the plurality of word lines 4330, sequentially. The plurality of cell contact plugs 4340 may be connected to the circuit region PERI by the upper bonding metals 4371b and 4372b of the cell region CELL and the lower bonding metals 4271b and 4272b of the peripheral circuit region PERI in the word line bonding area WLBA.

The plurality of cell contact plugs 4340 may be electrically connected to the circuit elements 4220b providing a row decoder 4394 in the peripheral circuit region PERI. In an example embodiment, operating voltages of the circuit elements 4220b providing the row decoder 4394 may be different than operating voltages of the circuit elements 4220c providing the page buffer 4393. For example, operating voltages of the circuit elements 4220c providing the page buffer 4393 may be greater than operating voltages of the circuit elements 4220b providing the row decoder 4394.

A common source line contact plug 4380 may be disposed in the external pad bonding area PA. The common source line contact plug 4380 may be formed of a conductive material such as a metal, a metal compound, polysilicon, or the like, and may be electrically connected to the common source line 4320. A first metal layer 4350a and a second metal layer 4360a may be stacked on an upper portion of the common source line contact plug 4380, sequentially. For example, an area in which the common source line contact plug 4380, the first metal layer 4350a, and the second metal layer 4360a are disposed may be defined as the external pad bonding area PA.

Input-output pads 4205 and 4305, 4405 and 4505 may be disposed in the external pad bonding area PA. Referring to FIG. 12 and FIG. 13, a lower insulating film 4201, 4501 covering a lower surface of the first substrate 4210, 4510 may be formed below the first substrate 4210, 4510, and a first input-output pad 4205, 4505 may be formed on the lower insulating film 4201, 4501. The first input-output pad 4205,4505 may be connected to at least one of the plurality of circuit elements 4220a, 4220b, and 4220c, 4520a, 4520b, and 4520c disposed in the peripheral circuit region PERI through a first input-output contact plug 4203, 4503, and may be separated from the first substrate 4210, 4510 by the lower insulating film 4201, 4501. In addition, a side insulating film may be disposed between the first input-output contact plug 4203, 4503 and the first substrate 4210, 4510 to electrically separate the first input-output contact plug 4203, 4503 and the first substrate 4210, 4510.

Referring to FIG. 12 and FIG. 13, an upper insulating film 4301, 4401 covering the upper surface of the second substrate 4310, 4410 may be formed on the second substrate 4310, 4410 and a second input-output pad 4305, 4405 may be disposed on the upper insulating layer 4301, 4401. The second input-output pad 4305, 4405 may be connected to at least one of the plurality of circuit elements 4220a, 4220b, and 4220c, 4520a, 4520b, and 4520c disposed in the peripheral circuit region PERI through a second input-output contact plug 4303, 4403.

According to embodiments, the second substrate 4310, 4510 and the common source line 4320 may not be disposed in an area in which the second input-output contact plug 4303, 4403 is disposed. Also, the second input-output pad 4305, 4405 may not overlap the word lines 4330, 4430 in the third direction (the Z-axis direction). Referring to FIG. 12 and FIG. 13, the second input-output contact plug 4303, 4403 may be separated from the second substrate 4310, 4410 in a direction, parallel to the upper surface of the second substrate 4310,4410, and may pass through the interlayer insulating layer 4315, 4415 of the cell region CELL to be connected to the second input-output pad 4305, 4405.

According to embodiments, the first input-output pad 4205, 4505 and the second input-output pad 4305, 4405 may be selectively formed. For example, the memory device 4000 may include only the first input-output pad 4205, 4505 disposed on the first substrate 4210, 4510 or the second input-output pad 4305, 4405 disposed on the second substrate 4310, 4410. Alternatively, the memory device 4000 may include both the first input-output pad 4205, 4505 and the second input-output pad 4305, 4405.

A metal pattern in an uppermost metal layer may be provided as a dummy pattern or the uppermost metal layer may be absent, in each of the external pad bonding area PA and PA_C, the bit line bonding area BLBA and the capacitor bonding area CLBA, respectively included in the cell region CELL and the peripheral circuit region PERI or in the capacitor region FR and the peripheral circuit region PERI.

In the external pad bonding area PA and PA_C, the memory device 4000 may include a lower metal pattern 4273a. 4573a, corresponding to an upper metal pattern 4372a, 4573a formed in an uppermost metal layer of the cell region CELL or the capacitor region CLBA, and having the same shape as the upper metal pattern 4372a, 4472a of the cell region CELL and the capacitor region FR, in an uppermost metal layer of the peripheral circuit region PERI. In the peripheral circuit region PERI, the lower metal pattern 4273a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL or the capacitor region FR.

The lower bonding metals 4271b and 4272b, 4571b and 4572b may be formed on the second metal layer 4240b, 4540b in the word line bonding area WLBA. In the word line bonding area WLBA, the lower bonding metals 4271b and 4272b of the peripheral circuit region PERI may be electrically connected to the upper bonding metals 4371b and 4372b of the cell region CELL by a Cu—Cu bonding.

Further, the bit line bonding area BLBA, an upper metal pattern 4392, corresponding to a lower metal pattern 4252 formed in the uppermost metal layer of the peripheral circuit region PERI, and having the same shape as the lower metal pattern 4252 of the peripheral circuit region PERI, may be formed in an uppermost metal layer of the cell region CELL. A contact may not be formed on the upper metal pattern 4392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

Figure 14:
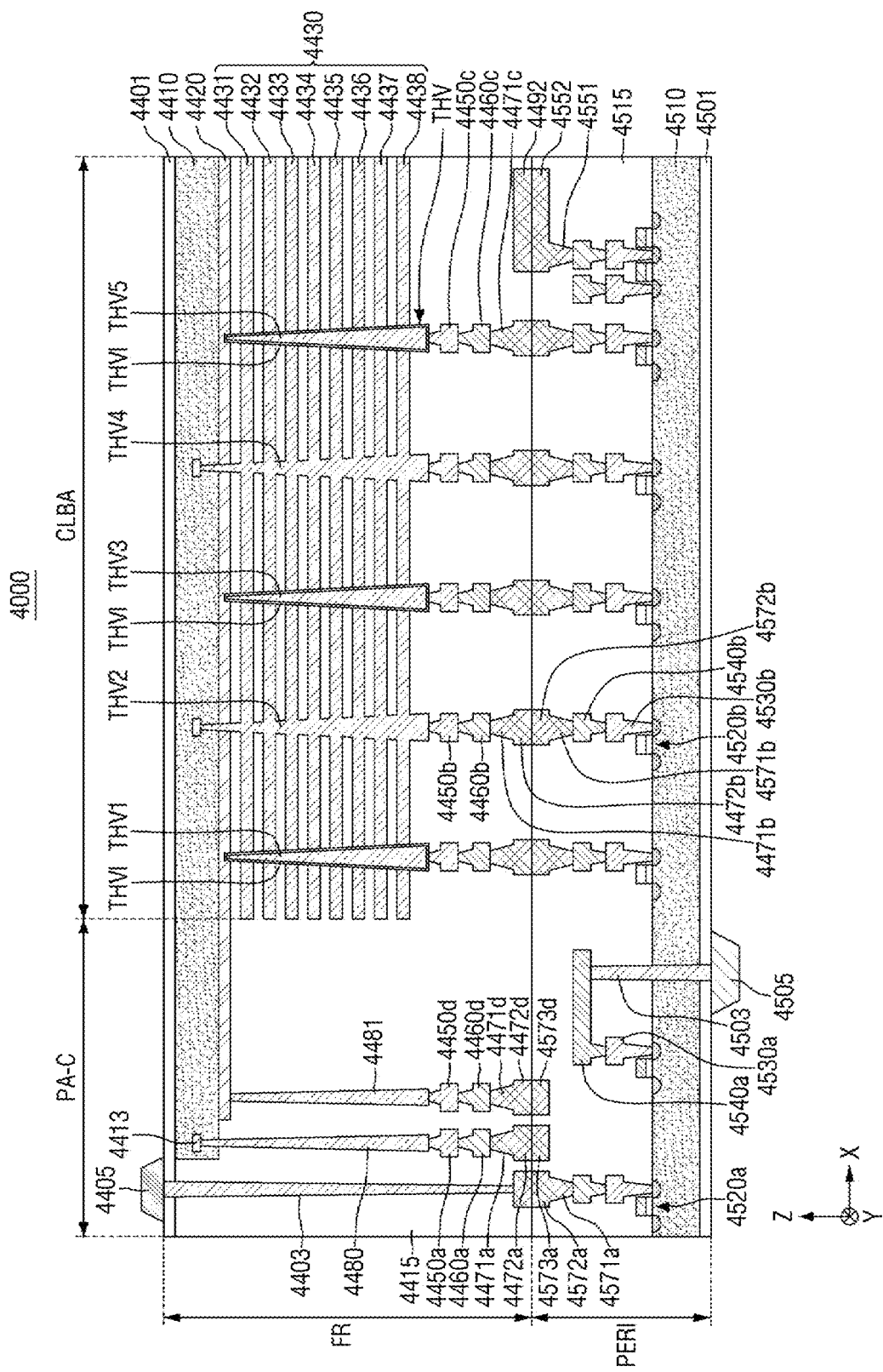
FIG. 14 is a sectional view of a capacitor region in a semiconductor memory device according to some embodiments of the present disclosure.

FIG. 14 is a sectional view of a capacitor region in a semiconductor memory device according to some embodiments of the present disclosure. For convenience of description, differences from FIG. 13 will be mainly described and a description thereof will not be repeated.

Referring to FIG. 14, a semiconductor memory device 4000 may include first through-via structures and second through-via structures. The first through-via structures and the second through-via structures may be disposed between at least two electrode isolation regions. In some embodiments, the first through-via structures and the second through-via structures may be alternately disposed. In some embodiments, only either the first through-via structures or the second through-via structures may be disposed. In some embodiments, the first through-via structures and the second through-via structures may be disposed in a matrix form between at least two electrode isolation regions.

A first through-via structure THV may include conductive regions THV1, THV3, and THV5 and through insulating films THVI, and electrode pads 4430 and the conductive regions THV1, THV3, and THV5 may form capacitors based on the through insulating films THVI. Second through-via structures THV2 and THV4 may include only conductive regions and be connected to the electrode pads, and may have the same potential which is applied through through channel contact lines in the peripheral circuit region connected to first and second metal layers 4450b and 4460b.

In some embodiments, the first through-via structures THV1, THV3, and THV5 may be connected to a horizontal semiconductor layer 4420 and, in some embodiments, may be connected to interconnection lines 4413 disposed between the horizontal semiconductor layer 4420 and an upper insulating film 4201. In some embodiments, the second through-via structures THV2 and THV4 may be connected to the horizontal semiconductor layer 4420 and, in some embodiments, may be connected to the interconnection lines 4413 disposed between the horizontal semiconductor layer 4420 and the upper insulating film 4201.

Figure 15:
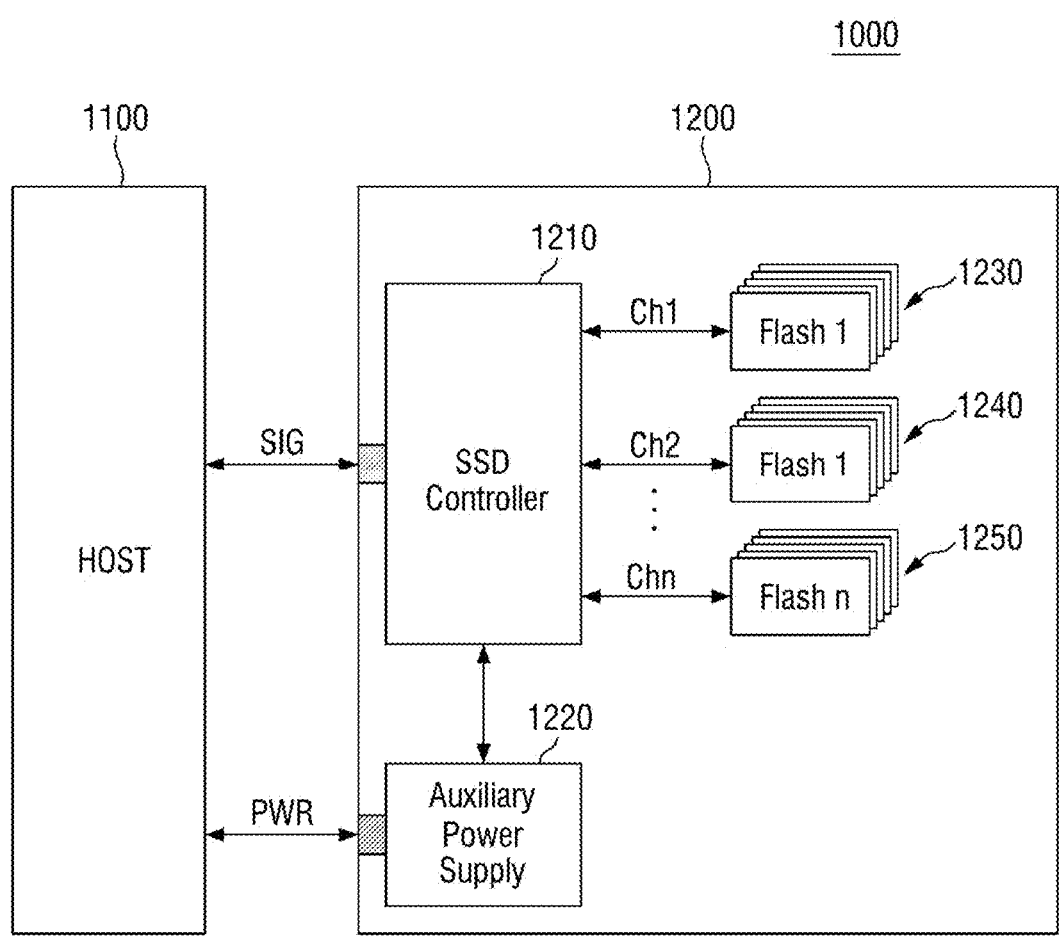
FIG. 15 is a block diagram of a storage device including a 3D semiconductor memory device, according to some embodiments of the present disclosure.

FIG. 15 is a block diagram of a storage device including a 3D semiconductor memory device, according to some embodiments of the present disclosure.

Referring to FIG. 15, in some embodiments, the storage device may be a solid state drive (SSD) system 1000.

The SSD system 1000 may include a host 1100 and an SSD 1200. The SSD 1200 may transmit signals to, and receive signals from, the host 1100 via a signal connector and may receive power via a power connector.

The SSD 1200 may include an SSD controller 1210, an auxiliary power device 1220 (e.g., power supply circuit), and a plurality of memory devices 1230, 1240, and 1250. The SSD controller 1210 may implemented with processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The SSD controller 1210 may operate in response to control signals, commands CMD, or instructions input thereto from an external source (e.g., host) and may control overall operations of the SSD 1200. The memory devices 1230, 1240, and 1250 may be VNAND flash memory devices and may be implemented in accordance with the embodiments of FIGS. 1 through 14. Accordingly, the memory devices 1230, 1240, and 1250 may have a high integration density.

Those skilled in the art will appreciate that many variations and modifications may be made to the presented embodiments without substantially departing from the principles of inventive concepts. Therefore, the presented embodiments are described in a generic and descriptive sense only and not for purposes of limitation.

What is claimed is:

1. A three-dimensional (3D) semiconductor memory device comprising:
   a first substrate including at least one first metal pad;
   a peripheral logic structure disposed on the first substrate and including a plurality of peripheral circuits;
   a second substrate disposed parallel to the first substrate and including at least one second metal pad;
   a horizontal semiconductor layer disposed on the second substrate, wherein the first metal pad and the second metal pad are vertically disposed and electrically connected to each other;
   a memory cell array region and at least one capacitor region on the horizontal semiconductor layer;
   a plurality of stack structures in the capacitor region, the plurality of stack structures including mold layers and electrode pads alternately stacked on the horizontal semiconductor layer in a first direction;
   a plurality of electrode isolation regions extending in the first direction and a second direction and configured to separate the plurality of stack structures in the capacitor region to be connected to the horizontal semiconductor layer; and
   a plurality of through-via structures configured to pass through the plurality of stack structures in the first direction in the capacitor region in the second substrate and having a first side connected to a through channel contact through the at least one second metal pad, wherein a capacitor is formed between each of the electrode pads in the capacitor region and at least one of the plurality of electrode isolation regions or at least one of the plurality of through-via structures, the capacitor is electrically connected to at least one of the plurality of peripheral circuits for the memory cell array region.

2. The 3D semiconductor memory device of claim 1, wherein:
 each of the plurality of electrode isolation regions includes a conductive pattern and a spacer which surrounds side surfaces of the conductive pattern; and
 each of the plurality of through-via structures includes a conductive region connected to each of the electrode pads.

3. The 3D semiconductor memory device of claim 1, wherein:
 each of the plurality of electrode isolation regions includes a conductive pattern connected to each of the electrode pads; and
 each of the plurality of through-via structures includes a conductive region and a through insulating film which surrounds side surfaces of the conductive region.

4. The 3D semiconductor memory device of claim 1, wherein the plurality of electrode isolation regions includes:
 a first electrode isolation region in which a conductive pattern and a spacer which surrounds side surfaces of the conductive pattern are included and which is separated from each of the electrode pads; and
 a second electrode isolation region in which a conductive pattern is included and which is connected to each of the electrode pads,
 wherein the first electrode isolation region and the second electrode isolation region are alternately disposed in a third direction.

5. The 3D semiconductor memory device of claim 1, wherein the plurality of through-via structures include:
 a first through-via structure including a conductive region and a through insulating film which surrounds side surfaces of the conductive region; and
 a second through-via structure including a conductive region and connected to each of the stack structures,
 wherein the first through-via structure and the second through-via structure are alternately disposed between at least two of the electrode isolation regions.

6. The 3D semiconductor memory device of claim 1, wherein:
 each of the plurality of through-via structures has a second side connected to the horizontal semiconductor layer; and
 the horizontal semiconductor layer is connected to the second metal pad and electrically connected to the peripheral circuits of the first substrate.

7. The 3D semiconductor memory device of claim 1, wherein:
 each of the plurality of through-via structures has a second side connected to any one of interconnection lines disposed on a lower surface of the horizontal semiconductor layer; and
 the interconnection lines are connected to the second metal pad and electrically connected to the peripheral circuits of the first substrate.

8. The 3D semiconductor memory device of claim 1, wherein the plurality of through-via structures include:
 a third through-via structure having a second side connected to the horizontal semiconductor layer; and a fourth through-via structure having a second side connected to any one of interconnection lines disposed on a lower surface of the horizontal semiconductor layer,
 wherein the third through-via structure and the fourth through-via structure are alternately disposed, and
 the horizontal semiconductor layer and the interconnection lines are connected to different second metal pads and electrically connected to the peripheral circuits of the first substrate.

9. The 3D semiconductor memory device of claim 1, wherein a distance between the plurality of electrode isolation regions in a case in which the through-via structures are disposed between adjacent electrode isolation regions is greater than a distance between the plurality of electrode isolation regions in a case in which there are no through-via structures between the adjacent electrode isolation regions.

10. The 3D semiconductor memory device of claim 9, wherein the distance between the plurality of electrode isolation regions in the case in which the through-via structures are disposed between the adjacent electrode isolation regions is at least three times greater than the distance between the plurality of electrode isolation regions in the case in which there are no through-via structures between the adjacent electrode isolation regions.

11. A three-dimensional (3D) semiconductor memory device comprising:
 a first substrate including a plurality of first metal pads;
 a horizontal semiconductor layer disposed on the first substrate;
 a plurality of stack structures in which mold layers and electrode pads are alternately stacked on the horizontal semiconductor layer in a first direction and which include a memory cell region and a capacitor region;
 a plurality of electrode isolation regions extending in the first direction and a second direction on the first substrate and which are spaced apart from each other in a third direction and separate the plurality of stack structures to be connected to at least one of the first metal pads;
 a plurality of through-via structures configured to pass through the stack structures in the first direction in the capacitor region between at least two adjacent electrode isolation regions and having a first side connected to at least another one of the first metal pads;
 a second substrate disposed parallel to the first substrate and including a plurality of second metal pads disposed to correspond to the plurality of first metal pads; and
 a plurality of peripheral circuits which are disposed on the second substrate and electrically connected to the first metal pads through the second metal pads,
 wherein the plurality of stack structures in the capacitor region have the same width and are stacked in the second direction and the third direction.

12. The 3D semiconductor memory device of claim 11, wherein each of the plurality of through-via structures has a second side connected to the horizontal semiconductor layer or to interconnection lines under the horizontal semiconductor layer from the first substrate.

13. The 3D semiconductor memory device of claim 11, wherein:
 each of the plurality of electrode isolation regions includes a conductive pattern passing through the plurality of stack structures in the first direction and a spacer which surrounds side surfaces of the conductive pattern; and each of the plurality of through-via structures includes a conductive region connected to each of the electrode pads.

14. The 3D semiconductor memory device of claim 11, wherein:
each of the plurality of electrode isolation regions includes a conductive pattern connected to each of the electrode pads while passing through the plurality of stack structures in the first direction; and
each of the plurality of through-via structures includes a conductive region and a through insulating film which surrounds side surfaces of the conductive region, and each of the plurality of through-via structures is separated from each of the electrode pads.

15. The 3D semiconductor memory device of claim 11, wherein the plurality of electrode isolation regions include:
a first electrode isolation region in which a conductive pattern and a spacer which surrounds side surfaces of the conductive pattern are included and which is separated from each of the electrode pads; and
a second electrode isolation region in which a conductive pattern is included and which is connected to each of the electrode pads,
wherein the first electrode isolation region and the second electrode isolation region are alternately disposed in the third direction in the capacitor region.

16. The 3D semiconductor memory device of claim 11, wherein the plurality of through-via structures include:
a first through-via structure in which a conductive region and a through insulating film which surrounds side surfaces of the conductive region are included and which is separated from each of the electrode pads; and
a second through-via structure including a conductive region and connected to each of the electrode pads,
wherein the first through-via structure and the second through-via structure are alternately disposed between at least two of the electrode isolation regions.

17. The 3D semiconductor memory device of claim 11, wherein the plurality of through-via structures include:
a first through-via structure having a second side connected to the horizontal semiconductor layer on the first substrate; and
a second through-via structure having a second side connected to any one of interconnection lines disposed on a lower surface of the horizontal semiconductor layer,
wherein the interconnection lines are connected to the second metal pads and electrically connected to the peripheral circuits of the second substrate, and
the first through-via structure and the second through-via structure are alternately disposed.

18. A three-dimensional (3D) semiconductor memory device comprising:
a first substrate; and
a second substrate disposed parallel to the first substrate,
wherein a plurality of first metal pads of the first substrate are disposed to be perpendicular to a plurality of second metal pads of the second substrate and are electrically connected to the plurality of second metal pads of the second substrate,
the first substrate includes a horizontal semiconductor layer disposed on the first substrate,
a capacitor region in which mold layers and electrode pads are alternately disposed on the horizontal semiconductor layer,
a plurality of electrode isolation regions each extending in a word line direction and a vertical direction so that the capacitor region is disposed to be spaced apart from each other,
a mold region disposed between two adjacent electrode isolation regions among the plurality of electrode isolation regions,
a plurality of through-via structures each passing through the mold regions in the vertical direction, and
a plurality of first metal pads connected to first sides of the plurality of electrode isolation regions or to first sides of the plurality of through-via structures,
the second substrate includes a plurality of peripheral circuits disposed on the second substrate, and
second metal pads disposed on the plurality of peripheral circuits and each of which is disposed in the vertical direction and electrically connected to the first metal pad, and
a capacitor is formed between each of the electrode pads and at least one of the plurality of through-via structures or at least one of the plurality of electrode isolation regions.

19. The 3D semiconductor memory device of claim 18, wherein, in the capacitor region, the electrode pads and the mold layers have the same length and are stacked on the horizontal semiconductor layer in the word line direction and a bit line direction.

20. The 3D semiconductor memory device of claim 18, wherein the first substrate further includes:
a wiring layer including one or more interconnection lines and disposed between the first substrate and the horizontal semiconductor layer; and
a connection contact plug extending in the vertical direction and configured to connect the wiring line to at least one of the first metal pads, and
at least some of the plurality of through-via structures have a second side passing through the horizontal semiconductor layer and connected to any one of the interconnection lines.

* * * * *